(12) United States Patent
Choi

(10) Patent No.: US 6,788,573 B2
(45) Date of Patent: Sep. 7, 2004

(54) NON-VOLATILE SEMICONDUCTOR MEMORY AND METHOD OF OPERATING THE SAME

(76) Inventor: Woong Lim Choi, Hyundai APT., 102-909, 278-10, Gaesin-dong, Hungduk-gu, Cheongju-shi, Chungcheongbuk-do (KR)

( * ) Notice: Subject to any disclaimer, the term of this patent is extended or adjusted under 35 U.S.C. 154(b) by 175 days.

(21) Appl. No.: 09/989,707
(22) Filed: Nov. 21, 2001
(65) Prior Publication Data US 2003/0039146 A1 Feb. 27, 2003

(30) Foreign Application Priority Data

Aug. 25, 2001 (KR) ..................................... P 2001-51566

(51) Int. Cl.$^7$ ............................................. G11C 16/04
(52) U.S. Cl. ........................... 365/185.05; 365/185.06; 365/185.14; 365/185.18; 257/315
(58) Field of Search ....................... 365/185.05, 185.06, 365/185.14, 185.18; 257/315, 316

(56) References Cited

U.S. PATENT DOCUMENTS

| | | | | |
|---|---|---|---|---|
| 5,100,818 A | * | 3/1992 | Arima et al. | ................ 438/265 |
| 6,064,592 A | * | 5/2000 | Nakagawa et al. | .... 365/185.05 |
| 6,151,248 A | * | 11/2000 | Harari et al. | .......... 365/185.14 |
| 6,317,349 B1 | * | 11/2001 | Wong | .......................... 365/49 |

* cited by examiner

*Primary Examiner*—Son T. Dinh
(74) *Attorney, Agent, or Firm*—Fleshner & Kim, LLP

(57) ABSTRACT

The present invention discloses a non-volatile semiconductor memory device and a method of operating the same. More specifically, the present invention includes a semiconductor substrate having active and field regions, at least two non-volatile storage transistors each of which having a storage on the active region and a control gate at the storage, wherein at least two control gates are incorporated into a single control plate, and at least two selection transistors each of which corresponds to the non-volatile storage transistor, wherein each of the selection transistors connected to the corresponding non-volatile storage transistors for selecting the corresponding non-volatile storage transistors.

74 Claims, 23 Drawing Sheets

FIG.3C

(UNIT: VOLTS)

| | SELECT GATE | CONTROL PLATE | DRAIN | SOURCE | P-SUB | P-WELL | DEEP N-WELL | REMARK |
|---|---|---|---|---|---|---|---|---|
| PROGRAM | VCC~10 | -7~10 | 2~7 | 0~2 | 0 | - | - | |
| | VCC~10 | -7~10 | 1~6 | 0~2 | 0 | -5~0 | 0 | TRIPLE WELL |
| ERASE | - | -13~-5 | - | 0~8 | 0 | - | - | |
| | - | 0 | - | 7~13 | 0 | - | - | |
| | 0~VPP OR FLOAT | -13~0 | FLOAT OR VPP | FLOAT OR VPP | 0 | VPP= VCC~13 | VPP | TRIPLE WELL |
| READ | VCC~7 | 0~7 | 0.5~2 | 0~1.5 | 0 | - | - | |
| | VCC~7 | 0~7 | 0.5~2 | 0~1.5 | 0 | 0 | 0 | TRIPLE WELL |

FIG.3D (UNIT: VOLTS)

| | SELECT GATE (WORD LINE) | | SELECTED CONTROL PLATE | DRAIN(BIT LINE) | | SELECTED SOURCE | P-SUB | P-WELL | DEEP N-WELL | REMARK |
|---|---|---|---|---|---|---|---|---|---|---|
| | SELECTED | UN-SELECTED CELL | | SELECTED CELL | UN-SELECTED CELL | | | | | |
| PROGRAM | VCC~10 | 0 | -7~10 | 2~7 | - | 0~2 | 0 | - | - | |
| | VCC~10 | 0 | -7~10 | 1~6 | - | 0~2 | 0 | -5~0 | 0 | TRIPLE WELL |
| | VCC~10 | 0~VCC OR FLOAT | -10~-3 | VCC~10 | 0 OR FLOAT | 0 OR FLOAT | 0 | - | - | |
| ERASE | 7~15 | 0 | 0 | 7~13 | 0 | FLOAT | 0 | - | - | |
| READ | VCC~7 | 0 | 0~7 | 0.5~2 | - | 0~1.5 | 0 | - | - | |

FIG.6C (UNIT: VOLTS)

| | WORD LINE (SELECTED) | CONTROL PLATE | BIT LINE SELECTED | BIT LINE UN-SELECTED | SOURCE LINE | P-SUB | P-WELL | DEEP N-WELL | REMARK |
|---|---|---|---|---|---|---|---|---|---|
| PROGRAM | VCC~10 | -7~10 | 2~7 | VS | VS | 0 | - | - | |
| PROGRAM | VCC~10 | -7~10 | 1~6 | VS | VS | 0 | -5~0 | 0 | TRIPLE WELL |
| ERASE | - | -13~-5 | 0 OR FLOAT | - | 0~8 | 0 | - | - | |
| ERASE | 0 | 0 | - | - | 8~13 | 0 | - | - | |
| ERASE | 0~VPP OR FLOAT | -13~0 | VPP OR FLOAT | - | FLOAT OR VPP | 0 | VPP= VCC~13 | VPP | TRIPLE WELL |
| READ | VCC~7 | 0~7 | 0.5~2 | VS | VS | 0 | - | - | |

FIG.6D

(UNIT: VOLTS)

| | WORD LINE | | CONTROL PLATE | BIT LINE | | SOURCE LINE | P-SUB P-WELL | DEEP N-WELL | REMARK |
|---|---|---|---|---|---|---|---|---|---|
| | SELECTED | UN-SELECTED | | SELECTED | UN-SELECTED | | | | |
| PROGRAM | VCC~10 | 0 | -7~10 | 2~7 | VS | VS | 0 | | |
| | VCC~10 | 0 | -7~10 | 1~6 | VS | VS | 0 | 0 | TRIPLE WELL |
| | VCC~10 | 0~VCC OR FLOAT | -10~-3 | VCC~10 | 0 OR FLOAT | 0 OR FLOAT | 0 | | |
| ERASE | 7~15 | 0 | 0 | 7~13 | - | FLOAT | -5~0 | | |
| READ | VCC~7 | 0 | 0~7 | 0.5~2 | VS | VS | 0 | - | |

FIG. 7C (UNIT: VOLTS)

| | WORD LINE | | CONTROL PLATE | BIT LINE | | SELECTED SOURCE LINE | P-SUBP-WELL | P-SUBP-WELL | DEEP N-WELL | REMARK |
|---|---|---|---|---|---|---|---|---|---|---|
| | SELECTED | UN-SELECTED | | SELECTED | UN-SELECTED | | | | | |
| PROGRAM | VCC~10 | 0 | -7~10 | 2~7 | VS | VS | 0 | — | — | |
| | VCC~10 | 0 | -7~10 | 1~6 | VS | VS | 0 | -5~0 | 0 | TRIPLE WELL |
| | VCC~ | — | -10~-5 | 0~8 | — | — | 0 | — | — | |
| | 0 | — | 0 | 8~13 | — | — | 0 | — | — | |
| ERASE | VCC~10 | 0 | -10~-3 | 0 OR FLOAT | — | VCC~10 | 0 | — | — | |
| | 0~VCC OR FLOAT | 0 | -13~0 | FLOAT OR VPP | — | FLOAT OR VPP | 0 | VPP=VCC~13 | VPP | TRIPLE WELL |
| READ | VCC~7 | 0 | 0~7 | 0.5~2 | VS | VS | 0 | — | — | |

FIG.9C
(UNIT: VOLTS)
|  | SELECT GATE | CONTROL PLATE | DRAIN | SOURCE | SUB |
|---|---|---|---|---|---|
| PROGRAM | $V_{th}+\alpha$ | -5~10 | 2~8 | 0~2 | 0 |
| ERASE | 0 | -10~-5 | 0~8 | - | 0 |
|  | 0 | 0 | 7~13 | - | 0 |
|  | VCC~20V | -8~0 | - | - | - |
| READ | VCC~7 | 0~7 | 0.5~2 | 0~1.5 | 0 |
FIG.9D
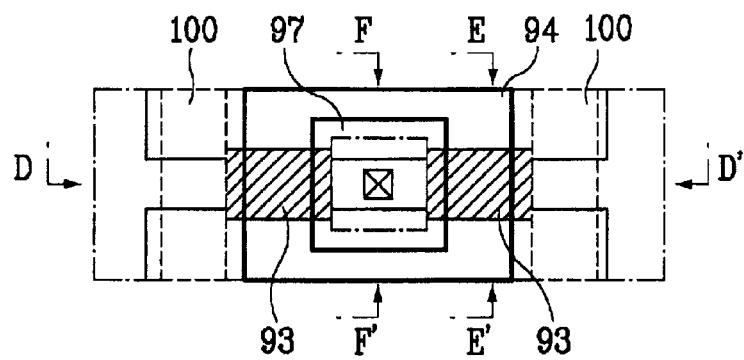
FIG.9E
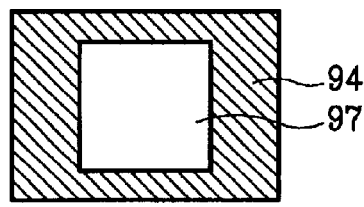

NON-VOLATILE SEMICONDUCTOR MEMORY AND METHOD OF OPERATING THE SAME

BACKGROUND OF THE INVENTION

1. Field of the Invention

The present invention relates to a semiconductor device, and more particularly, to a non-volatile semiconductor memory and a method of operating the same.

2. Discussion of the Related Art

A semiconductor memory device capable of reading and writing digital data electrically is divided into an EEPROM enabling to program and erase data by a cell unit and a flash memory enabling to erase data only by a block unit over several tens and hundreds bytes and record data by a byte unit.

A conventional EEPROM has been widely used to re-write data by using a small data unit. However, the conventional EEPROM cell includes a pair of transistors. Thus, it occupies a relatively large area. As a result, the conventional EEPROM has a difficulty in realizing a large capacity. In addition, it is fabricated with a high cost.

A memory cell of the conventional flash memory including only one transistor increases an erase unit size instead of reducing a cell size. However, the conventional flash memories have some difficulties in achieving desirable operational characteristics and device reliabilities. Such problems become serious as a design rule is reduced, thereby becoming obstacles or limitations for reducing a cell size.

Such non-volatile memories are fabricated by using various processes to be used for a single memory device. In order to build various functional blocks in SoC (system-on-chip) where the various functional blocks forming a system are integrated on one chip, an EEPROM and a flash memory should be fabricated through the same manufacturing process. In addition, each of the cell sizes thereof should be reduced. Further, they should be operable in low supply voltage.

A non-volatile memory according to a related art is explained by referring to the attached drawings as follows.

FIG. 1A illustrates a cross-sectional view of a single transistor type flash memory cell according to the related art, and FIG. 1B illustrates a layout of the single transistor type flash memory cell of FIG. 1A.

Referring to FIG. 1A, the cell includes a source region 2 and a drain region 3 formed in the surface area of a P-type semiconductor substrate 1. A channel region will be generated between the source and drain regions 2 and 3. A gate oxide layer 4, a floating gate 5, and a control gate 7 are stacked on the channel region of the substrate 1. An inter-poly oxide (IPO) layer 6 is formed between the floating and control gates 5 and 7.

The floating gate 5 stores electric charges therein while the control gate 7 induces a voltage on the floating gate 5.

The floating and control gates 5 and 7 are formed as a stacked structure, as shown in FIG. 1A. The source and drain regions 2 and 3 are formed in the semiconductor substrate 1 to be in parallel with both lateral sides of the stacked gates, thereby forming a unit block of a single transistor. A channel hot carrier injection is generally used for a cell programming in this type cell.

Specifically, for the cell programming, about 5V is applied to the drain region 3. The source region 2 is grounded (0V). About 8V is applied to the control gate 7. Thus, hot channel electrons are injected into the floating gate 5.

When an erasing is carried out on the unit block, 0V or a negative high voltage is applied to the control gate 7 while a positive high voltage is applied to the source region 2 or the semiconductor substrate 1. Thus, a tunneling of the electric charges occurs in the direction of the source region 2 or the semiconductor substrate 1.

FIG. 1B illustrates a layout of the flash memory cell having the stacked structure shown in FIG. 1A.

Referring to FIG. 1B, unit cells 11 are separated from each other by a field insulating area 10. Each control gate 15 of the respective cells is connected to a corresponding word line 12. The word lines 12 are separated from each other. A bit line 13 is formed in the direction perpendicular to the word line 12, and each drain region 17 of the respective cells is connected to the bit line 13 through a bit line contact 14.

Although the single transistor stacked type cell has a reduced cell size, it has serious disadvantages as follows. When erasing data in every non-volatile memory, over-erasure phenomena, a threshold voltage of a cell dropped below 0V during erasing, may take place statistically. On a non-volatile memory with a single transistor staked type cell, if at least one cell in a selected bit line is over-erased, it is unable to read the status of the cells in the same bit line.

Generally, non-uniformity in the manufacturing process and process-induced stress applied to a dielectric layer surrounding the floating gate may cause the over-erasure. A designing technique may solve such an over-erasure problem. Meanwhile, a circuit construction becomes complicated. Therefore, the over-erasure in a single transistor staked type cell should be eliminated at all costs.

In addition, the over-erasure is not allowed in the single transistor stacked type cell and furthermore, an erasing is carried out by the block unit over several tens kilobytes, thereby broadening a statistical threshold voltage distribution of the erased block. Therefore, an actual range of the allowable threshold voltage range becomes much narrower.

An electric charge status in the non-volatile memory cell (i.e., the threshold voltage) corresponds to a logical status of the memory cell. A range of the allowable threshold voltage of the single transistor stacked type cell lies approximately between 1V and 5V.

When a reading voltage of 3.3V is applied to the control gate, a cell current proportional to a difference between 3.3V and 1.0V flows in case that a low level of the threshold voltage is 1V. In the cell programmed with 5V, a current fails to flow since a channel of the cell is blocked.

Therefore, it stores digital data of 1 bit in each cell by reading the current conditions in the following and blocking corresponding to two levels of "1" and "0", respectively.

Meanwhile, a data reading speed of a memory is proportional to the cell current on the reading. Thus, the speed becomes faster when the cell current is large, while the speed becomes slower when the cell current is small. Therefore, the lower the low level of the threshold voltage is, the larger the cell current is and the faster the reading speed is.

The single transistor stacked type cell according to the related art has a relatively high threshold voltage of over 0V in the low level. Thus, it has a small cell current so that it makes very difficult to improve a reading speed without increasing the read voltage applied to the control gate over the supply voltage level. If the threshold voltage of each memory cell is defined as more than four levels, each of the memory cells enables to store logic data having two bits or more (multi-bits memory). When a programming is carried out with multi-levels, four or more levels of the threshold voltage between the allowable threshold voltages of 1V to 5V should be programmed and read.

In this case, when intervals between the threshold voltage levels become narrower, a reading speed becomes slower and the cell is vulnerable to various noises. Therefore, the intervals in the threshold voltage cannot be reduced further. The wide intervals of the entire allowable threshold voltage range enable to readily realize a multi-bits memory as well as increase a memory speed.

Unfortunately, the single transistor stacked type memory cell having a narrow range of the allowable threshold voltage is unable to realize a reading operation with a high speed and a low voltage. Thus, it is difficult to be implemented as a high-speed multi-bits memory.

Further, the single transistor stacked type cell has much difficulty in reducing a size in accordance with a design rule in the scale under about 0.18 µm, thereby causing problems/disadvantages in cell characteristics and reliability.

A drain of a floating gate storage transistor, which corresponds to a cell in a memory array constructed with the above-described cells, is directly connected to a bit line, while a source terminal thereof is connected to a common ground line.

In such a memory array, a drain-turn-on, a punch-through or a high leakage current occurs due to the coupling to the floating gate by a drain voltage. Hence, during the programming, an over-current is produced by the unselected cells on the selected bit line. Such an effect is amplified as the channel length becomes shorter, so that it is difficult to reduce a cell size.

Moreover, in such a memory array, there are problems such as a hot electron injection, which is caused by a leakage current for the unselected cells on the selected bit line, and stored electric charge leakage due to an electric field stress and the like. Such problems become more serious in a multi-bits cell having narrow intervals between the levels of the threshold voltage.

Processes of forming contacts and metal lines are carried out on the drain side of the storage transistor, thereby degrading an oxide layer near the floating gate of the cell during the processes.

Due to all the problems/disadvantages as discussed above, the cell size can be hardly reduced in accordance with the miniaturization of the processes as long as a flash memory cell includes a single transistor.

Unfortunately, the single transistor stacked type cell is improper for incorporating a system chip with a logic process as well as a stand-alone non-volatile memory for a deep sub-micron process technology.

Generally, the stacked type cell as shown in FIGS. 1A and 1B having a low coupling ratio for a control gate is disadvantageous in a low voltage operation. An increased coupling ratio of a non-volatile memory cell is absolutely necessary for efficiently coping with a system driven by a lower voltage such as portable devices.

The problems/disadvantages of the single transistor stacked type cell may be overcome by adding a serially connected floating gate transistor (I) and a selection transistor (II) as a two-transistor EEPROM cell, in FIG. 2A.

FIG. 2A illustrates a cross-sectional view of a two-transistor EEPROM cell according to a related art, and FIG. 2B illustrates a layout of the two-transistor EEPROM cell in FIG. 2A. FIGS. 2C and 2D illustrate circuits of two-transistor EEPROM cells according to related arts.

Referring to FIG. 2A, the two-transistor EEPROM cell includes source and drain regions 22 and 23 formed in the surface area of a P-type semiconductor substrate 21. A portion between the source and drain regions 22 and 23 becomes a channel region. A gate oxide layer 24 and a floating gate 25 are formed on the channel region. A control gate 27 surrounds the floating gate 25.

A dielectric (inter-poly oxide) layer 26 is formed between the floating gate 25 and the control gate 27.

The floating gate 25 stores electric charges, and the control gate 27 induces a voltage on the floating gate 25.

A selection transistor (II) uses the drain region 23 of a floating gate transistor (I) as a source region thereof. The selection transistor has another drain region 23a leaving another channel region therebetween, and is formed at one side of the floating gate transistor (I).

On the channel region of the selection transistor (II), another gate oxide layer 24a having a thickness equal to or different from the gate oxide layer of the floating gate oxide layer 24. A gate 28 of the selection transistor (II) is formed on the gate oxide layer 24a.

A layout of the above-described cell is shown in FIG. 2B. In the EEPROM according to the related art, control gates of adjacent cells on the same active region should be separated from each other with a margin 'B' by photolithography and an etch process as follows.

As well known in the art, a minimum size of a circuit line width is limited by a resolution of photolithography.

The EEPROM shown in FIGS. 2A and 2B has a floating gate and a control gate defined over the floating gate by lithography. It requires a margin 'A' amounting to a process tolerance at the side of the floating gate. Therefore, the EEPROM according to the related art is inevitably increased in its cell size as long as the margin 'A' and 'B' exist in FIGS. 2A and 2B.

Further, in the EEPROM according to the related art, a high voltage greater than 15V is applied to a source or drain junction of the cell. Thus, it has large-sized p-n junction of the respective terminals, thereby increasing the cell size.

Arrays of the EEPROM according to the related art are illustrated as shown in FIGS. 2C and 2D. In FIG. 2C, a drain of a selection transistor is connected to a bit line. On the other hand, a drain of a storage transistor (floating gate transistor) is connected to a bit line in FIG. 2D.

In these array architectures, each control gate line is separated at every row and a control gate of each cell at the row is connected to the control gate line of the corresponding row.

Thus, the array composed of the control gate lines separated on every row requires complicated circuitry in decoding the respective lines.

SUMMARY OF THE INVENTION

Accordingly, the present invention is directed to a non-volatile semiconductor memory and a method of operating the same that substantially obviates one or more of problems due to limitations and disadvantages of the related art.

Another object of the present invention is to provide the non-volatile semiconductor memory and the method of operating the same that enables to maintain a stable operation and provides reliability.

Another object of the present invention is to provide the non-volatile semiconductor memory and the method of operating the same that enables to realize a small cell size and reduces a cell size in accordance with a down-scale in photolithography.

A further object of the present invention is to provide the non-volatile semiconductor memory and the method of operating the same that realizes a high-speed multi-bits operation.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a non-volatile semiconductor memory according to the present invention includes a semiconductor substrate having active and field regions, at least two non-volatile storage transistors each having a storage at the active region and a control gate at the storage, wherein each control gate is incorporated into a single control plate, and at least two select transistors each of which corresponds to each non-volatile storage transistor, wherein each of the selection transistors is connected to the corresponding non-volatile storage transistor for selecting the corresponding non-volatile storage transistors.

Accordingly, the present invention reduces a cell size greatly and simplifies its fabrication process by incorporating a plurality of control gates of the at least two adjacent cells into a single body in a two-transistor structure.

The present invention provides many advantages such as operational stability and device reliance of a two-transistor structure as well as a feasibility of a high-speed multi-bits non-volatile memory in a low-voltage.

In the present invention, each non-volatile memory cell includes at least one selection transistor.

The control plate is unable to be realized by a single transistor cell because a control gate in the single transistor cell works as a selection transistor to select a cell. Namely, if the control gate connects two adjacent cells, adjacent word lines are short-circuited to each other in an array. Thus, it is unable to select one of the word lines independently.

In the present invention, the selection gate is separated from the control plate. Thus, the control gates of the two adjacent cells are connected to each other through one body. Namely, even if the non-volatile storage transistors of the cells located on at least two rows (word lines) and the same bit line (column), a selectivity of the respective cells, which is governed by each of the corresponding selection transistors, is free from such an influence.

Accordingly, in a non-volatile memory cell according to the present invention, at least one selection transistor corresponding to a non-volatile storage transistor in each cell is connected in series to one end or both ends of the non-volatile storage transistor. Moreover, the non-volatile storage transistor may be separated from the selection transistor through a junction as a source or drain. Instead, the non-volatile storage and selection transistors may have a split-gated structure in which gates are split from each other on one continuous channel. Further, the control plate of the non-volatile semiconductor memory according to the present invention may cover two adjacent cells or a block unit comprising at least two adjacent cells.

In another aspect of the present invention, in a non-volatile semiconductor memory including at least two non-volatile storage transistors each of which including a source in the substrate, a drain in the substrate, a storage on the dielectric layer over the active region, and a control gate at the storage, at least two control gates incorporating into a control plate built in a single body, and at least two selection transistors each of which including a source in the substrate, a drain in the substrate, a selection gate on the dielectric layer between the source and the drain to be isolated from the storage, wherein the source of each of the selection transistors is the drain of the corresponding non-volatile storage transistor, and each of the two selection transistors is connected to the corresponding non-volatile storage transistor for selecting the corresponding non-volatile storage transistor, a method of operating the non-volatile semiconductor memory includes selecting one of the non-volatile storage transistors by turning on or off the respective selection transistors, and programming the selected non-volatile storage transistor using a hot carrier injection method generating hot electrons from a channel of the selected non-volatile storage transistor.

Preferably, the channel hot carrier injection method is one of a first method of applying a reverse bias having a predetermined level between the source of the selected non-volatile storage transistor and the substrate, a second method of increasing a voltage of the control plate of the selected non-volatile storage transistor gradually from a low voltage, and a third method of combining the first and second methods.

Preferably, the stored electric charges are discharged for an erasing operation by forming a high electric field between the storage of the corresponding non-volatile storage transistor and the source or substrate using tunneling.

Preferably, for a reading operation, the selection transistor of the selected cell is turned on and a proper positive voltage is applied thereto in accordance with a read current required for the control plate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIG. 3C illustrates a table for operating conditions for the non-volatile semiconductor memory in a flash memory mode according to the first embodiment of the present invention;

FIG. 3D illustrates a table for operating conditions for the non-volatile semiconductor memory in an EEPROM mode according to the first embodiment of the present invention;

FIG. 6C illustrates a table for operating conditions for the non-volatile semiconductor memory in the flash memory mode according to the second embodiment of the present invention;

FIG. 6D illustrates a table for operating conditions for the non-volatile semiconductor memory in the EEPROM mode according to the second embodiment of the present invention;

FIG. 7C illustrates a table for operating conditions for the non-volatile semiconductor memory in the flash memory mode according to the third embodiment of the present invention;

FIG. 9C illustrates a table for operating conditions for the non-volatile semiconductor memory in a flash memory mode according to the fifth embodiment of the present invention;

FIG. 9D illustrates a layout of the non-volatile semiconductor memory according to the fifth embodiment of the present invention;

FIG. 9E illustrates a structure of a control plate in FIG. 9D;

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1A:
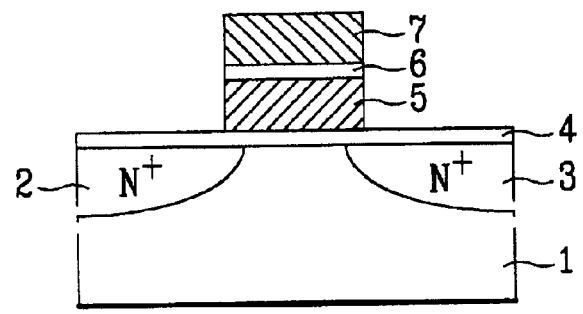
FIG. 1A illustrates a cross-sectional view of a single transistor type flash memory cell according to a related art.
Figure 1B:
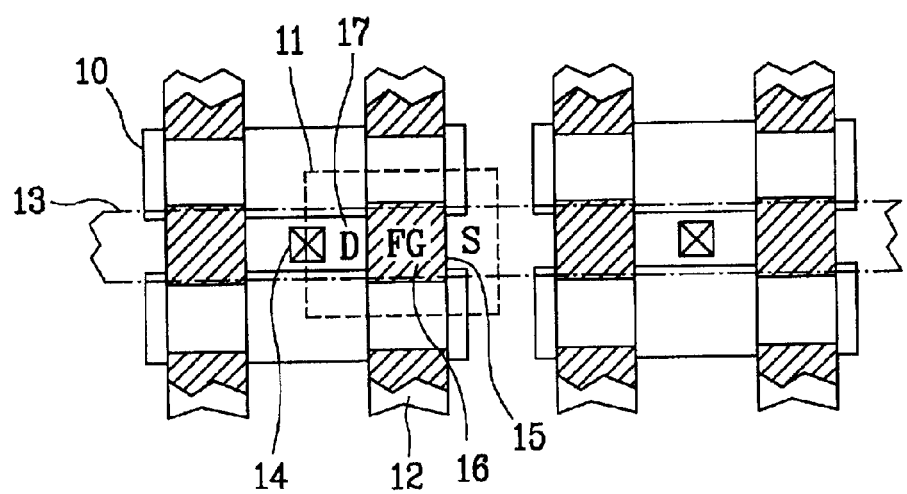
FIG. 1B illustrates a layout of the single transistor type flash memory cell in FIG. 1A.
Figure 2A:
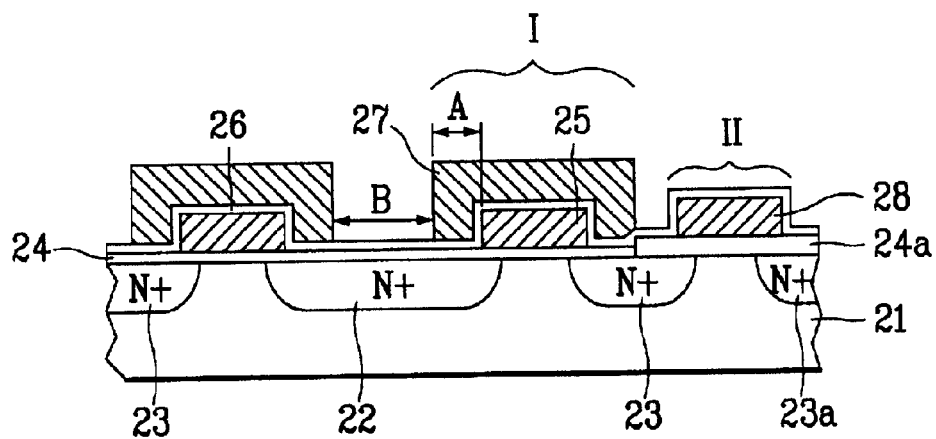
FIG. 2A illustrates a cross-sectional view of a two-transistor EEPROM cell according to a related art.
Figure 2B:
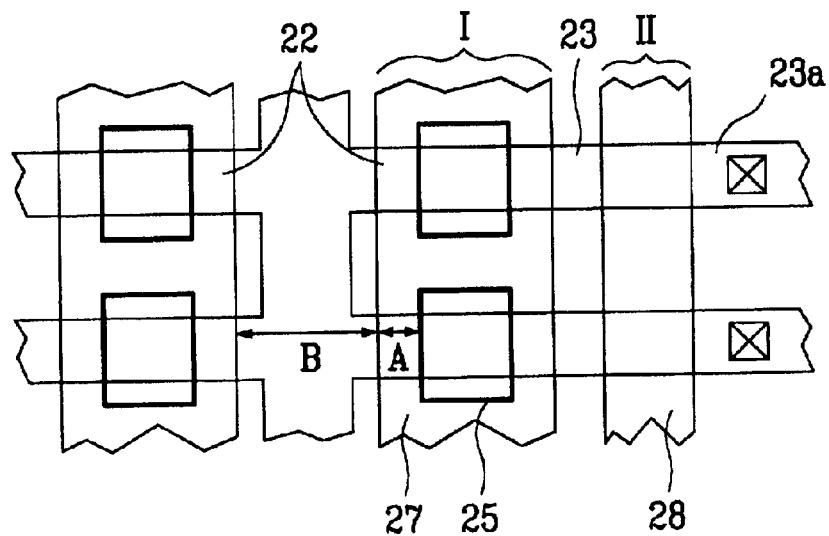
FIG. 2B illustrates a layout of the two-transistor EEPROM cell in FIG. 2A.
Figure 2C:
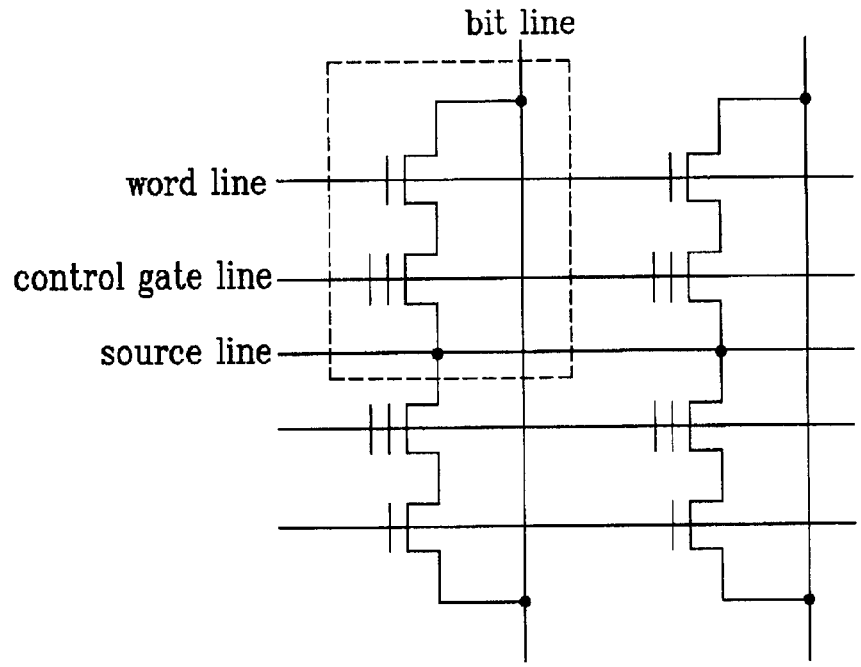
FIGS. 2C and 2D illustrate circuit diagrams of two-transistor EEPROM cells in FIG. 2A.
Figure 2D:
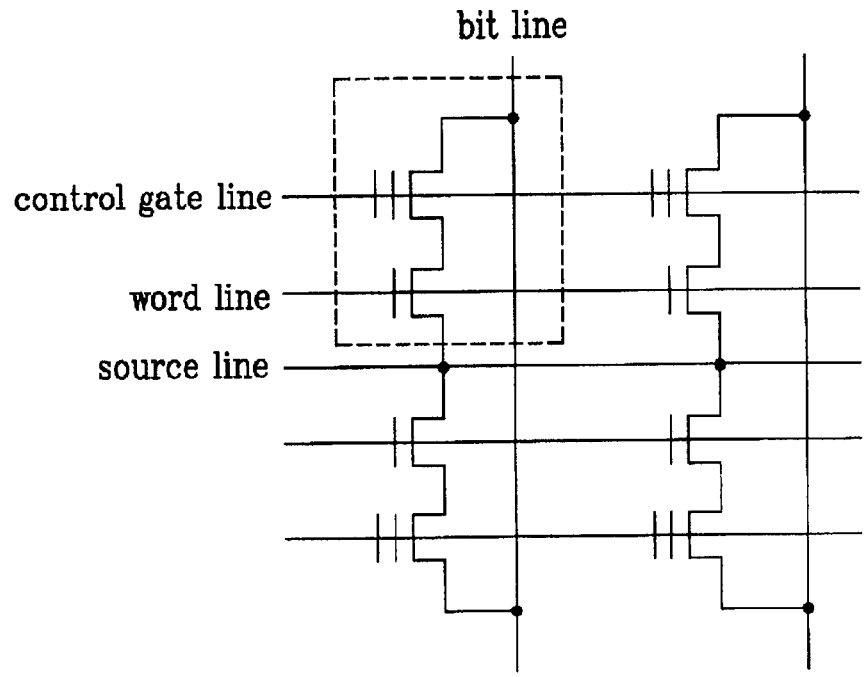
Figure 3A:
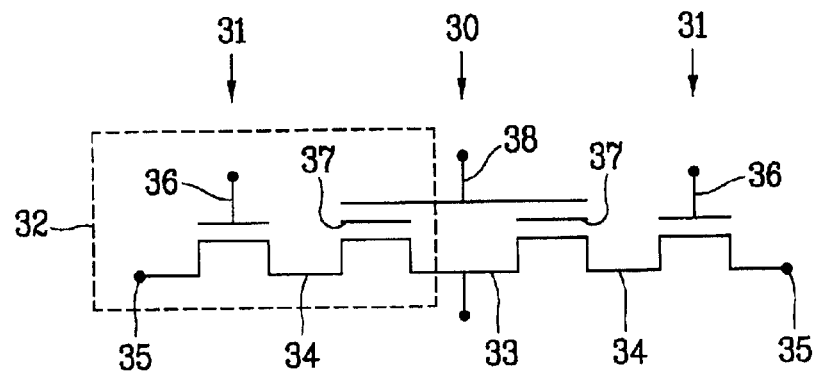
FIGS. 3A and 3B illustrate schematic diagrams for a unit block and an array of a non-volatile semiconductor memory according to a first embodiment of the present invention.
Figure 3B:
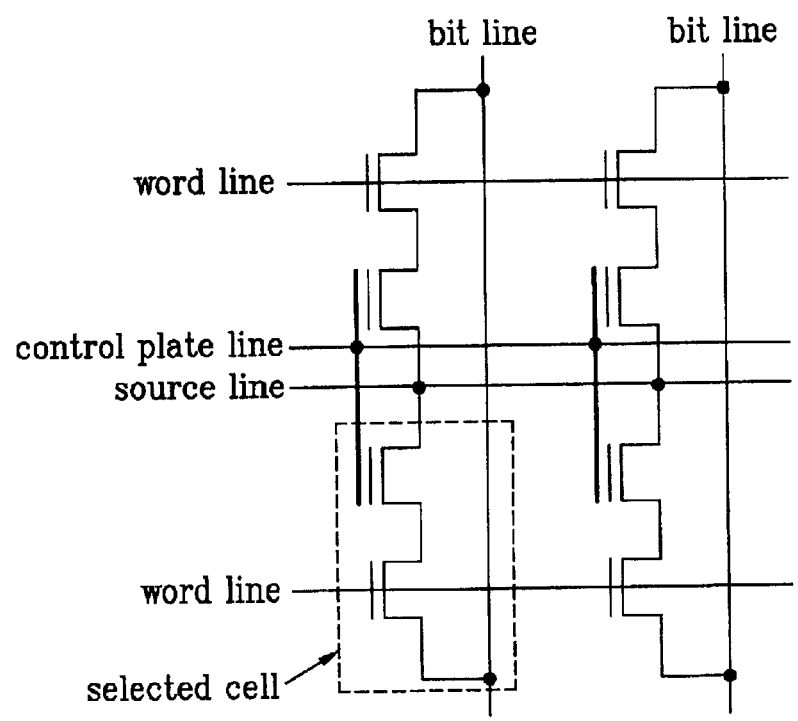

FIGS. 3A and 3B illustrate schematic diagrams for a unit block and an array of a non-volatile semiconductor memory according to a first embodiment of the present invention.

Referring to FIG. 3A, a non-volatile semiconductor memory device includes two adjacent non-volatile memory cells. Each cell 32 includes a selection transistor 31 and a non-volatile storage transistor 30 connected to each other in series, thereby forming a two-transistor structure.

The non-volatile semiconductor memory cell in the first embodiment includes a semiconductor substrate, a tunneling dielectric layer, a pair of non-volatile storage transistors, and a pair of selection transistors.

The semiconductor substrate includes active and field regions at the surface area. The tunneling dielectric layer is formed on the semiconductor substrate.

Each of the non-volatile storage transistors includes source and drain regions in the semiconductor substrate, a non-volatile storage on the tunneling dielectric layer between the source and drain regions, and a control gate formed over the non-volatile storage.

A pair of the control gates may be incorporated into a single control plate formed as a single body in the length direction of the active region. Sources of the two non-volatile transistors below the control plate form one common source.

Even though the first embodiment of the present invention is a non-volatile memory device having the two cells, the control plate corresponds to at least two control gates so that the non-volatile memory device has at least one control plate.

Each of the selection transistors includes source and drain regions formed in the semiconductor substrate and a selection gate formed on a dielectric layer having different thickness from the tunneling dielectric or the tunneling dielectric layer between the source and drain regions, so that it is separated from the non-volatile storage.

Each source of the selection transistors is a drain of the corresponding non-volatile storage transistor. Each of the selection transistors is connected to the corresponding non-volatile storage transistor in order to operate for selecting the corresponding non-volatile storage transistor.

Each of the sources of the selection transistors carries out a programming or an erasing through the storage gate and the tunneling dielectric layer of the corresponding non-volatile storage transistor.

The source of each of the selection transistors may include first and second sources. The second source has the same impurity type as that of the first source. However, it has a different doping density from the first source.

The first source carries out a programming through the storage gate and the tunneling dielectric layer of the corresponding non-volatile storage transistor. The second source carries out an erasing through the storage gate and the tunneling dielectric layer, which will be explained in detail hereinafter.

In this case, the programming and erasing may be performed through a "hot carrier injection" and a "tunneling", respectively.

Detailed explanations of the first embodiment of the present invention as follows.

Each of the selection transistors 31 in the respective non-volatile memory cells is constructed with a selection gate 36 to select or cut off the corresponding non-volatile storage transistor 30, a source terminal 34, and a drain terminal 35.

The non-volatile storage transistor 30 is constructed with a control plate 38 formed as a single body and shared by the adjacent cell, a common source terminal 33, and a drain terminal 34. The source of the selection transistor 31 and the drain terminal of the corresponding non-volatile storage transistor 30 become one terminal. Sources of the two adjacent cells share a common source terminal.

As mentioned in the foregoing explanation, the non-volatile storage transistors 30 of the adjacent two cells are connected to each other through the control plate 38. Each of the cells includes a corresponding portion of the control plate 38, a channel in the substrate below the corresponding portion of the control plate 38, source and drain regions at both sides of the channel, and a floating gate 37 located below the corresponding portion as a non-volatile storage to control a conductivity of the channel.

The non-volatile storage may be a floating gate storing electric charges therein. Alternatively, it may be a non-conducting dielectric material storing the electric charges. Moreover, the non-volatile storage may be a ferroelectric material storing data as a form of electric fields therein.

When the non-volatile storage is formed of a dielectric material such as SONOS (silicon-oxide-nitride-oxide-silicon), a control plate is formed on the dielectric material without a floating gate and may be formed of the same conductive material (for example, polysilicon) for a selection gate. Therefore, the cell may be constructed with one gate material.

A portion of the control plate corresponding to each of the non-volatile storage transistor may partially overlap the channel region. Further, the non-volatile storage may be located over a portion, the entire portion, or an edge of the channel.

The control plate may be formed as a single body by using the same process. Instead, the control plate may be separately constructed through different processes so as to be connected through an electrically conductive body.

The above-described storages and the control plate may be applicable to all other embodiments of the present invention.

The first embodiment according to the present invention assumes that NMOS transistors are formed on a P-type semiconductor substrate. However, PMOS transistor cells may be also formed on an N-type semiconductor substrate, which is well realized by using the polarity opposite to that of the NMOS transistors.

FIG. 3B illustrates an array of the non-volatile semiconductor memory according to the first embodiment of the present invention, in which an array is constructed with the non-volatile memory device in FIG. 3A as a unit.

In order to construct a highly-integrated array, non-volatile memory devices are arranged as a matrix form based on the circuit as shown in FIG. 3A as a unit. Thus, a non-volatile memory array having a desired size may be constructed.

More specifically, the array includes a plurality of bit lines arranged in a column direction, a plurality of word lines arranged in a row direction, a plurality of source lines arranged in the row direction, a plurality of control plate lines arranged in the row direction, and a plurality of non-volatile memory cells formed between the lines.

Each cell based on the construction shown in FIG. 3A includes at least one storage transistor having a non-volatile storage on a corresponding channel region and commonly connected to the source line, at least one selection transistor connected in series to the corresponding storage transistor where gate and drain are connected to the word line and the bit line respectively, and at least one control plate built as a single body at the upper part of the non-volatile storage of the storage transistor and connected to the control plate line.

A source of each of the selection transistors acts as a drain of the corresponding non-volatile storage transistor. Each of the selection transistors is connected to the corresponding non-volatile storage transistor. At least the two control gates form one of the control plate built as a single body in a length direction of the active region. At least two sources form one common source. Each source of the selection transistors carries out a programming or an erasing by using the tunneling dielectric layer and non-volatile storage of the corresponding non-volatile storage transistor. Each drain of the selection transistors is connected to the corresponding bit line in the column direction. Each common source of the cells is connected to the corresponding source line in the row direction. Each selection gate of the selection transistors is connected to the corresponding word line in the row direction. Each of the control plates shared by at least two adjacent cells is connected to the corresponding control plate line.

The control plate lines or the word lines may be formed of the same material as the control plates and the selection gates by using the same process.

Programming, erasing, and reading operations of the non-volatile semiconductor memory according to the first embodiment of the present invention are explained in view of a flash memory mode and an EEPROM mode.

FIG. 3C illustrates a table for operating conditions for the non-volatile semiconductor memory in a flash memory mode according to the first embodiment of the present invention. FIG. 3D illustrates a table for operating conditions for the non-volatile semiconductor memory in an EEPROM mode according to the first embodiment of the present invention. In other words, FIG. 3C illustrates a table for operating conditions for the corresponding selected cell.

Operating conditions mostly relates to the cases of writing and erasing data at a floating gate or a dielectric by using electric charges.

A programming operation of the cell selected in FIG. 3A uses a hot electron injection mechanism, while an erasing operation uses a tunneling mechanism.

When the programming is performed, a voltage between an input voltage Vcc and 10V boosted at a high voltage circuit is applied to a selection gate of a cell selected for enabling a current to pass through a non-volatile storage transistor. A voltage between −7V and 10V is also applied to a control plate. A voltage, which forms an electric field enabling to generate hot electrons from a channel of the non-volatile storage transistor, is applied between end terminals of a drain and a source.

For example, Vcc may be 5V, 3.3V, 1.8V and the like. Vcc may be further decreased below 1.8V.

In a conventional programming method using hot carrier injection, a programming speed is relatively high. However, each cell consumes too high current, which is higher than several hundreds μA.

Such a programming current is generally supplied by a booster circuit having a poor power efficiency. Thus, it may be difficult to realize a current supply circuit provided that a size of the circuit block increases or that an input voltage is too low.

When this kind of the programming method is applied to the two-transistor type cell according to the related art, a width of the selection transistor should be greatly increased or a high voltage should be applied to the selection gate so that a high current over several hundreds μA passes through. Instead of using channel hot electrons, the two-transistor cell according to the related art uses FN (Fouler-Nordheim) tunneling consuming less current despite a low speed or a junction avalanche mechanism.

In order to solve/overcome such problems, the present invention applies a reverse voltage between a substrate and a source terminal where a junction is formed, thereby increasing a programming efficiency several times higher than that of the related art. In addition, a program current is greatly reduced.

For instance, a substrate voltage is maintained at 0V, and a source voltage (0 to 2V) higher than 0V and lower than a voltage applied to a drain may be applied to a source.

In case of a triple well structure using a P-type substrate where a channel is formed, a negative voltage between (−)5V to 0V is applied to a P-type well (shown in FIG. 4D) in an N-type well. A voltage between 1V and 6V is applied to a drain. A voltage between 0 and 2V is applied to a source.

Such a back bias effect results in reducing the current consumption as well as increasing the programming efficiency, for which physical phenomena are well known in the art.

In addition, a high-speed channel hot carrier injection programming may be realized at a low current by carrying out the programming in a manner that a voltage of the control plate is increased gradually and successively or by using both methods.

The current consumption of the cell during the programming is reduced provided that the programming is carried out in a manner that the voltage of the control plate is increased gradually. The voltage of the control plate may be increased linearly or stepwise.

Such a voltage ramping method is well known in the art.

In FIG. 3C, the voltage of the control plate may be programmed with a selected value between (−)7V and 10V or by successively increasing a value from the selected value to a higher value.

The selection gates of the unselected cells are supplied with 0V or grounded when the programming or reading is carried out in the array of the cell.

In the above programming method, the selection transistors of the selected cells and the unselected cells sharing the word line with the selected cell are turned on. Therefore, a leakage current can flow through the unselected cells when a source bias is applied on the selected source line. This leakage current can be eliminated if the same voltage is applied between the sources and drains of the not-selected cells sharing the selected source line. When the programming is carried out by applying a source voltage to the selected cell, each of the bit lines crossing the selected source line should receive the same voltage of the source voltage so that the leakage current may be prevented.

Moreover, during the programming, by using a sense amplifier a channel current of the cell for a voltage applied to the control plate may be monitored. Thus, the programming is terminated once the monitored current reaches a reference current. In this case, the termination of the programming is achieved by making a zero voltage difference between the source and drain. In addition, the selection transistor or the storage transistor may be turned off.

Alternatively, the programming is carried out by the tunneling or junction avalanche mechanism if necessary.

In the erasing operation, the electric charges stored by programming are erased through a source terminal by applying a high electric field between the floating gate and the source by applying a voltage between (−)13V and (−)5V to the control plate and the other voltage between 0 and 8V to the source terminal or by applying 0V to the control gate and a high positive voltage to the source terminal only.

In this case, the selection gate is floated, supplied with 0V, or supplied with a small negative voltage when a negative voltage is applied to the control gate. A drain terminal may be floated or receives 0V or any arbitrary voltage.

The conditions in FIG. 3C are for a flash memory operation mode. Thus, the erasing operation is carried out at each block unit.

Meanwhile, when an N-type well (deep N well) is formed in a P-type substrate and a P-type well is formed in the N-type well so that a memory according to the present invention will be formed in the P-type well, electric charges of the floating gate (or a non-volatile storage) may be erased through/toward the P-type well by applying a voltage between (−13)V and 0V to the control plate and another voltage between Vcc and 13V to the P-type well as for the triple wells as shown in FIG. 3C.

In this case, the source and drain terminals, which are turned on in a forward direction, may be floated or receive the same voltage as the P well voltage while a voltage (Vcc to 13V) equal to or higher than that of the P-type well is applied to the N well so as to prevent a turn-on state between the P-type and N-type wells.

Moreover, the selection gate of the selected cell or the selected erasing block may be floated, supplied with 0V or a voltage equal to or less than the P-type well voltage, while the selection gates of the unselected erasing block may be floated or supplied with a voltage equal to or less than the P-type well voltage.

When a non-volatile memory according to the present invention is formed on the triple wells, a control plate of the unselected cell in the erasing operation may be floated or supplied with 0V. Moreover, a loss in the electric charges in the unselected cell may be prevented by applying a voltage between Vcc and 13V thereto.

When a reading operation is carried out, a selection transistor is turned on by applying an input voltage Vcc or a boost voltage to the selected cell up to 7V in accordance with the design rule of the cell. A current level of the non-volatile storage transistor is sensed through a sensing circuit connected to a bit line by applying a voltage between 0 and about 7V to a control plate depending upon a single bit, multi-bits or an amount of the requested reading current, a voltage of 0.5~2V to a drain, and a voltage of 0~1.5V to a source in accordance with the operating conditions.

Such a sensing operation may also be carried out in the triple well structure.

FIG. 3D is an example of operating conditions in the EEPROM operational mode for erasing and programming the cells in FIG. 3A by a unit cell.

A selection gate of a two-transistor cell enables only the selected cell to be erased or programmed, thereby making an EEPROM.

Conversely, such an EEPROM function cannot be realized in a single-transistor cell. On the other hand, a two-transistor non-volatile memory cell according to the present invention functions in both the flash memory and EEPROM modes.

Namely, at any cases, a programming is carried out selectively on the respective cell units in the two-transistor non-volatile memory cell. However, a flash memory, as mentioned in the above explanation, erases by a block unit.

Therefore, the programming conditions shown in FIG. 3D are identical to those of the flash memory mode shown in FIG. 3C.

When an erasing operation is carried out, a negative voltage between (−10)V and (−3)V is applied to a control plate of a selected cell, a voltage between Vcc and 10V is applied to a drain of a selection transistor of the selected cell through a bit line, and a positive voltage between Vcc and 10V is applied to a selection gate belonging to the selected cell.

Thus, the voltage applied to the drain passes through the selection transistor so as to be applied to the drain (i.e., a source of the selection transistor) of the non-volatile storage transistor.

In this case, a source terminal of the selected cell is floated or grounded. Thus, electric charges of a floating gate is erased through the drain terminal of the non-volatile storage transistor by a strong electric field between the floating gate (or a storage) of the selected cell and the drain of the non-volatile storage transistor.

Unselected cells, as the same as the programming, are not erased in a manner that a bit line voltage is not applied to the drain of the non-volatile storage transistor by cutting off a channel of the selection transistor on the cells of the unselected word lines. The unselected bit lines are simply grounded so that the cells on the unselected bit lines cannot be erased.

Instead, the erasing operation may be achieved using positive voltages by applying only a positive voltage between 7V and 13V to the drain terminal through the bit line, a voltage between 7V and 15V to a selection gate of the selected cell through a word line, and applying 0V to the control plate.

A layout, a cross-sectional view, and a fabrication method of a non-volatile semiconductor memory according to the first embodiment are explained as follows.

Figure 4A:
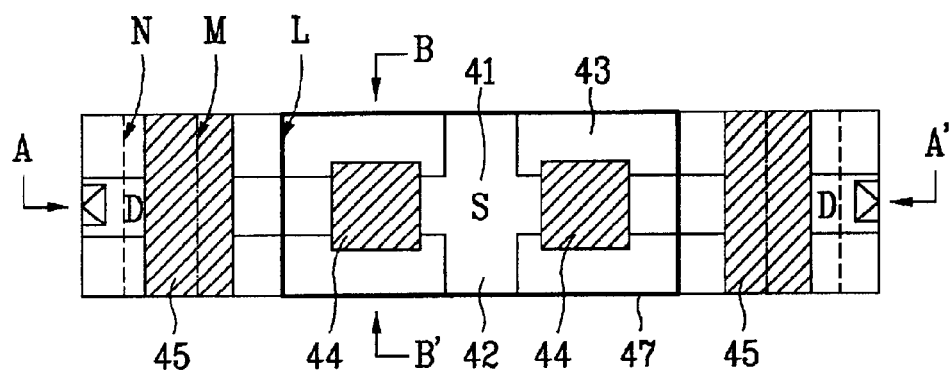
FIG. 4A illustrates a layout of the non-volatile semiconductor memory according to the first embodiment of the present invention.

FIG. 4A illustrates a layout of the non-volatile semiconductor memory according to the first embodiment of the present invention.

Figure 4B:
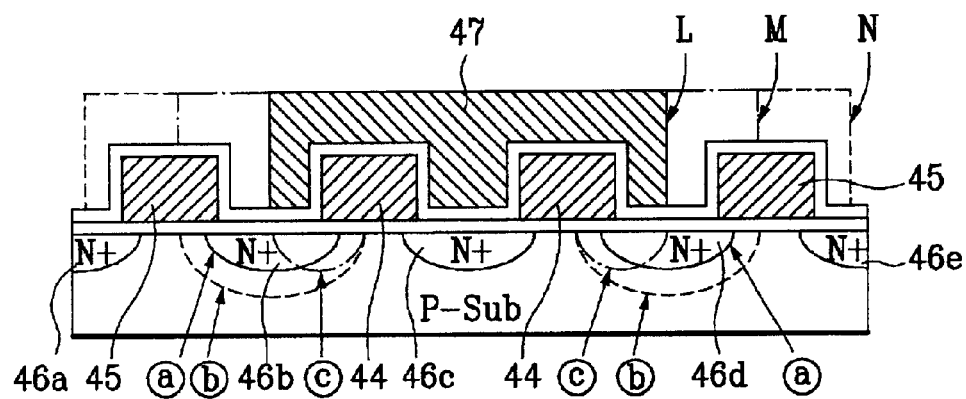
FIG. 4B illustrates a cross-sectional view in accordance of line A–A' in FIG. 4A.
Figure 4C:
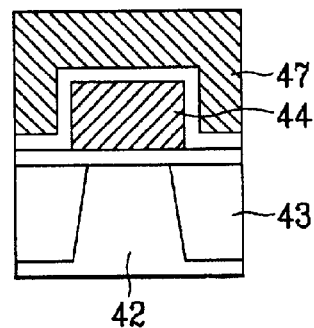
FIG. 4C illustrates a cross-sectional view in accordance of line B–B' in FIG. 4A.

FIG. 4B illustrates a cross-sectional view in accordance of line A–A' in FIG. 4A, and FIG. 4C illustrates a cross-sectional view in accordance of line B–B' in FIG. 4A.

Figure 4D:
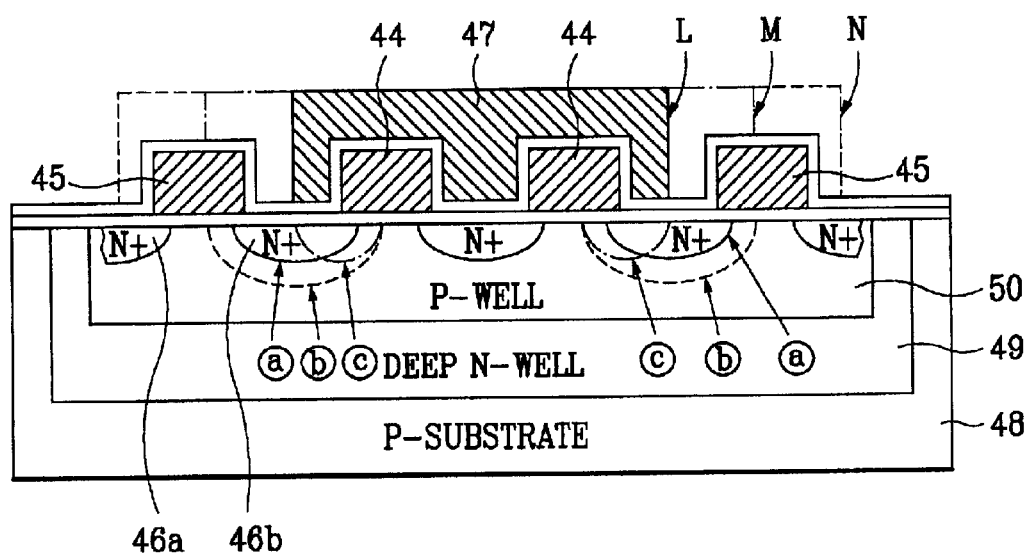
FIG. 4D illustrates a cross-sectional view of a triple well structure in accordance with line A–A' in FIG. 4A.

FIG. 4D illustrates a cross-sectional view of a triple well structure in accordance with line A–A' in FIG. 4A.

FIG. 4A represents a floating gate as an electric charge storage.

When four or more than four cell arrays are constructed, the structure shown in FIG. 4A is repeated so as to arrange the cell arrays.

In FIGS. 4A and 4B, two cells are symmetrically arranged to locate a common source region 41 between the cells. Active regions 42 of the cells are isolated each other by field isolation regions 43. On each of the active regions 42, a floating gate 44 and a selection gate 45 are arranged in series. Source/drain regions 46a to 46e are formed at both lateral sides of the floating and selection gates 44 and 45.

Drain regions of the two cells are connected to a bit line through contact junction parts, while the source region is formed as a common region. Thus, a source diffusion region forms a source line in a direction perpendicular to the bit line.

Moreover, a junction profile of a storage transistor drain region in FIG. 4B may be formed as a feature ⓐ or double profiles such as features ⓐ and ⓑ or features ⓐ and ⓒ so as to separate spots where electric charges pass through a tunneling oxide layer when a programming or an erasing is carried out. In this case, a region of the feature ⓐ has a diffusion depth shallower than that of the feature ⓑ or ⓒ and a doping density higher than that of the feature ⓑ or ⓒ.

In order to achieve the junction profiles, a double ion implantation for P(Phosphorous) and As(Arsenic) having different coefficients may be introduced. Also, in order to achieve the profile of the feature ⓒ, an ion implantation is carried out on an opened region by photolithography, from the middle part of a drain region of a storage transistor to the middle part of a floating gate.

When such a double-junction structure is formed, hot electrons are generated from a diffusion region located deep in a channel region so as to be injected into a floating gate while the programming is carried out.

Meanwhile, a stronger electric field is formed between a floating gate and a shallow diffusion region having a relatively high doping density, so that electric charges are erased mainly through the shallow diffusion region by a tunneling. Therefore, even though the programming and erasing are carried out at the same junction part, degradation of the oxide layer is reduced, and endurance and reliance are improved.

A control plate 47 of a cell according to the present invention is formed with one plate so as to cover the floating gates 44 of the two adjacent cells.

In this case, the common source region 41 is formed by using self-alignment with both of the right and left floating gates 44. The control plate 47 over the common source region 41 is formed with one plate so as not to be separated by the respective cells. Therefore, a length of a source region is minimized up to a process limit of photolithography.

Moreover, since the control plate is defined between the floating gates 44 and selection gates 45, a process for forming the control plate 47 is carried out regardless of a tolerance in photolithography.

Instead, when a gate of a selection transistor is formed prior to a control plate, edges of the control plate may be placed right onto the gate of the selection transistor (M) or defined to surround the selection gate (N).

Such methods of defining a control plate are applied to other embodiments according to the present invention.

If a process includes that selection and floating gates are formed and then a control gate is formed, and edges of the control plate are defined to locate between the floating and selection gates, it is useful for the application of an embedded non-volatile memory. Such a process is advantageous because the control plate may be formed of the same material (e.g. polysilicon) as a gate material of a logic device. In addition, metal silicide may be formed by simultaneously opening the upper surfaces of a selection gate, a logic device, and a control plate.

Silicide is formed of a metallic compound including Ti (titanium), Co (cobalt) or the like on the surface of polysilicon gate or silicon of source/drain and the like, thereby reducing contact resistance and wire resistance. Using silicide is a basic technique in a logic process.

A cross-sectional view in FIG. 4D is similar to that in FIG. 4B except for a triple well structure in the substrate.

Referring to FIG. 4D, an N-type well 49 is formed in a P-type substrate 48, and a P-type well 50 is formed in the N-type well 49.

A non-volatile memory is formed in the P-type well 50.

A method of fabricating a non-volatile semiconductor memory according to the first embodiment of the present invention may be processed by the following steps.

Figure 5A:
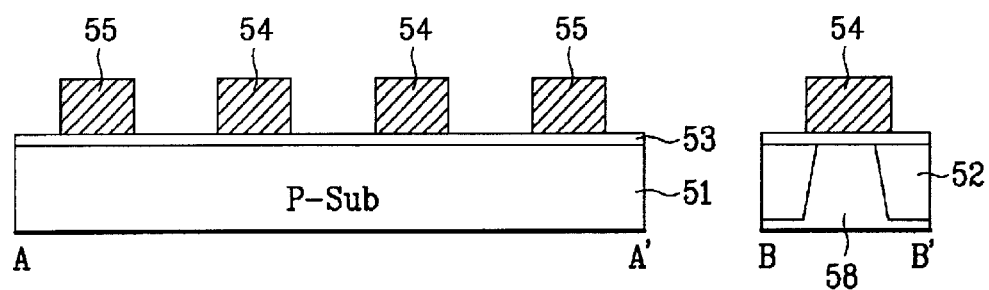
FIGS. 5A and 5B illustrate cross-sectional views of fabricating the non-volatile semiconductor memory according to the first embodiment of the present invention.
Figure 5B:
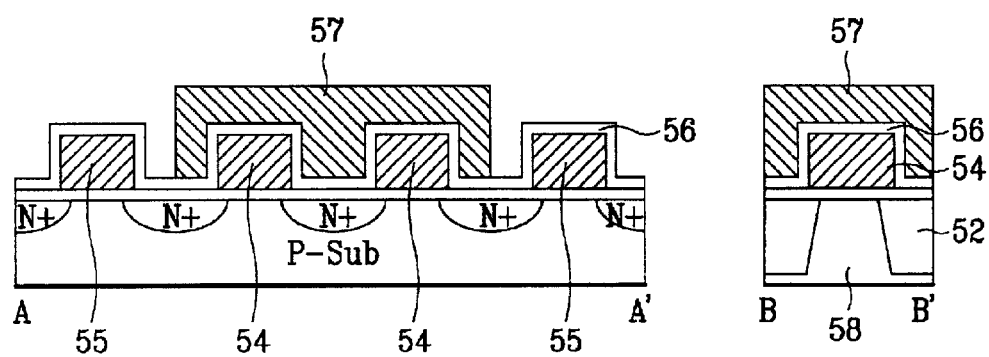

FIGS. 5A and 5B illustrate cross-sectional views of fabricating the non-volatile semiconductor memory according to the first embodiment of the present invention.

Referring to FIG. 5A (showing a pair of cross-sectional views along lines A–A' and B–B' in FIG. 4A), a field isolation region 52 and an active region 58 are defined in a semiconductor substrate 51. A tunneling oxide layer 53 is then formed on the active region.

After a first conductor such as a polysilicon film has been deposited on the tunneling oxide layer 53, a plurality of floating gates 54 and selection gates 55 are formed by photolithography and a successive etch process.

Referring to FIG. 5B, source/drain regions are formed by implanting impurity ions into the semiconductor substrate using the floating and selection gates 54 and 55 as a mask.

In this case, a gate oxide layer, which is formed of a high voltage oxide layer formed separately from the tunneling oxide layer, is located below the selection gates 55. The gate oxide layer may be formed thicker than the tunneling oxide layer 53 below the floating gates 54.

A thin dielectric layer 56 is formed over the semiconductor substrate including the above structure. A second polysilicon is formed on the thin dielectric layer 56.

In this case, the dielectric layer 56 may be formed by thermal oxidation or CVD (chemical vapor deposition). Alternatively, the dielectric layer 56 may be formed of a composite material such as ONO (oxide-nitride-oxide) or the like.

Successively, a second conductor such as a polysilicon layer is deposited thereon. A control plate 57 is then formed from the second conductor by photolithography.

Accordingly, the method of fabricating the non-volatile memory according to the present invention is simple, thereby providing a stable non-volatile memory merged-logic process for a system chip and realizing an embedded non-volatile memory structure.

Explanation of a non-volatile semiconductor memory according to a second embodiment of the present invention is described as follows.

Figure 6A:
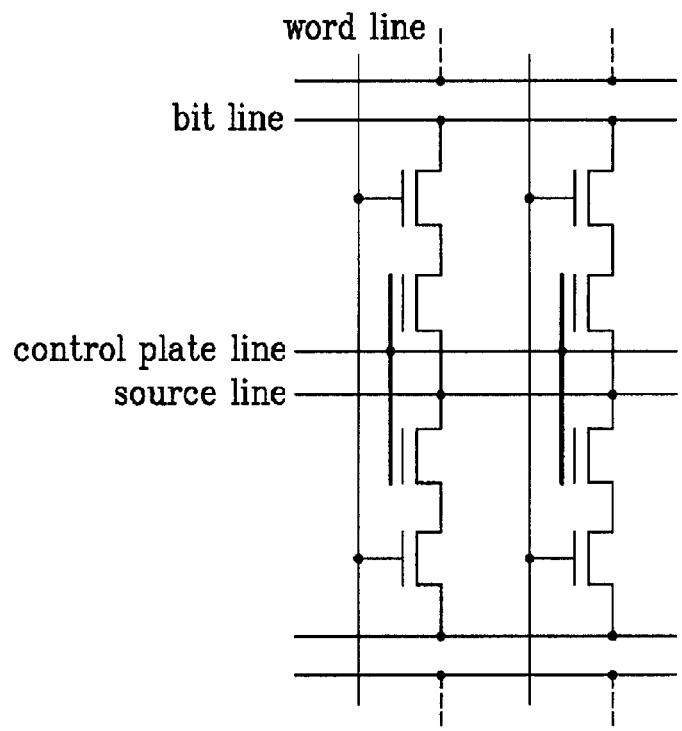
FIGS. 6A and 6B illustrate structures of a unit block and an array of a non-volatile semiconductor memory according to a second embodiment of the present invention.
Figure 6B:
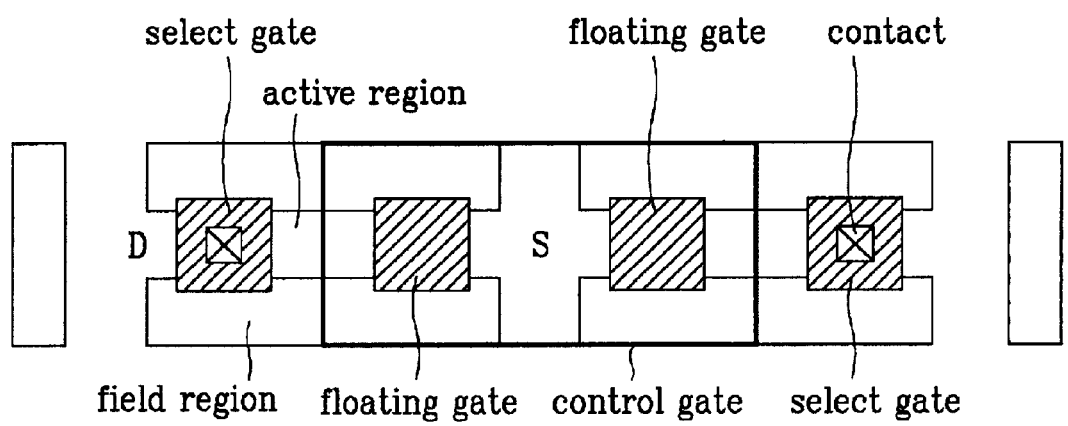

FIGS. 6A and 6B illustrate structures of a unit block and an array of a non-volatile semiconductor memory according to a second embodiment of the present invention.

A cell structure of the second embodiment according to the present invention is similar to that shown in FIGS. 3A to 3D, FIGS. 4A to 4D, and FIGS. 5A and 5B except for an array structure.

Referring to FIG. 6A, drains of the cells are connected to bit lines perpendicular to a channel direction of each cell.

A selection gate of each cell is connected to a corresponding word line arranged to be perpendicular to the bit lines. Thus, the word lines are arranged in the channel direction of the cells. Each source of the cell is connected to a source line located to the same direction of the bit lines. A control plate is connected to a control plate line in the same direction of the bit lines.

FIG. 6B shows a layout of the cells as an example. Thus, the second embodiment is not limited to the corresponding drawing.

Referring to FIG. 6B, a plurality of contacts are formed on selection gates so as to be connected to the word line, and the bit line is formed with a diffusion region. In this case, since the bit line has a high resistance, the resistance may be reduced by strapping a metal line.

Moreover, in order to reduce resistance of polysilicon and the diffusion region, silicide, which is formed of a combination of polysilicon and metal such as W, Co or the like, may be used instead. Such a fabrication process may be applied to other embodiments according to the present invention.

The non-volatile semiconductor memory according to the second embodiment of the present invention is operated in a flash mode or an EEPROM mode in accordance with the following operating conditions.

FIG. 6C illustrates a table for operating conditions for the non-volatile semiconductor memory in the flash memory mode according to the second embodiment of the present invention. FIG. 6D illustrates a table for operating conditions for the non-volatile semiconductor memory in the EEPROM mode according to the second embodiment of the present invention.

Explanation of operating a cell array in the flash mode follows with reference to FIG. 6C.

As the first embodiment of the present invention, a programming is carried out by using channel hot carrier injection. An erasing operation is carried out by using "tunneling". Operating conditions of the cells are similar to those of the embodiment shown in FIG. 3A except for the following difference.

When a voltage Vs is applied to the source of a cell selected by the reading or programming operation, a leakage current is prevented by applying Vs equal to a source voltage to a bit line connected to a drain of the opposite cell sharing the source with a word line of the selected cell.

In this case, the word line turns on the selection gates of the two cells sharing the source with each other, and a control plate turns at the storage transistors of the two cells. Thus, the unselected adjacent cell maintains a turn-on state. Therefore, a voltage equal to a common source voltage should be applied to the drain of the unselected adjacent cell.

The word line turns on the two adjacent cells, and the bit lines are separated from one another so as to cross the word line perpendicularly. Hence, there is no problem in selective operations of the cells.

Similarly, the EEPRM mode in FIG. 6D is similar to the embodiment in FIG. 3D except for in the above-explained Vs effect.

Explanation of a non-volatile semiconductor memory according to a third embodiment of the present invention is described as follows.

Figure 7A:
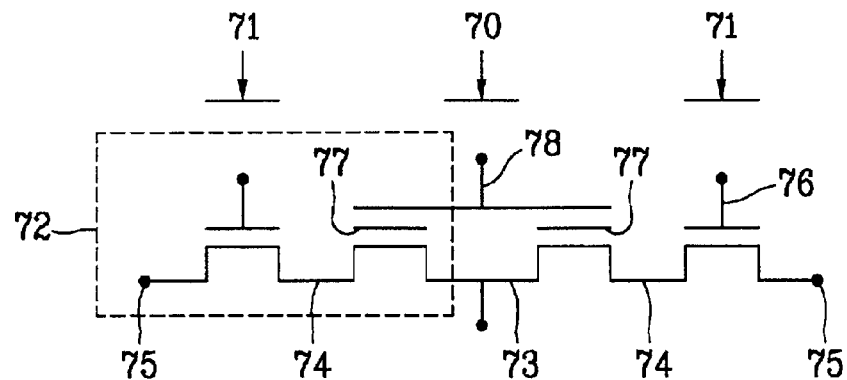
FIGS. 7A and 7B illustrate structures of a unit block and an array of a non-volatile semiconductor memory according to a third embodiment of the present invention.
Figure 7B:
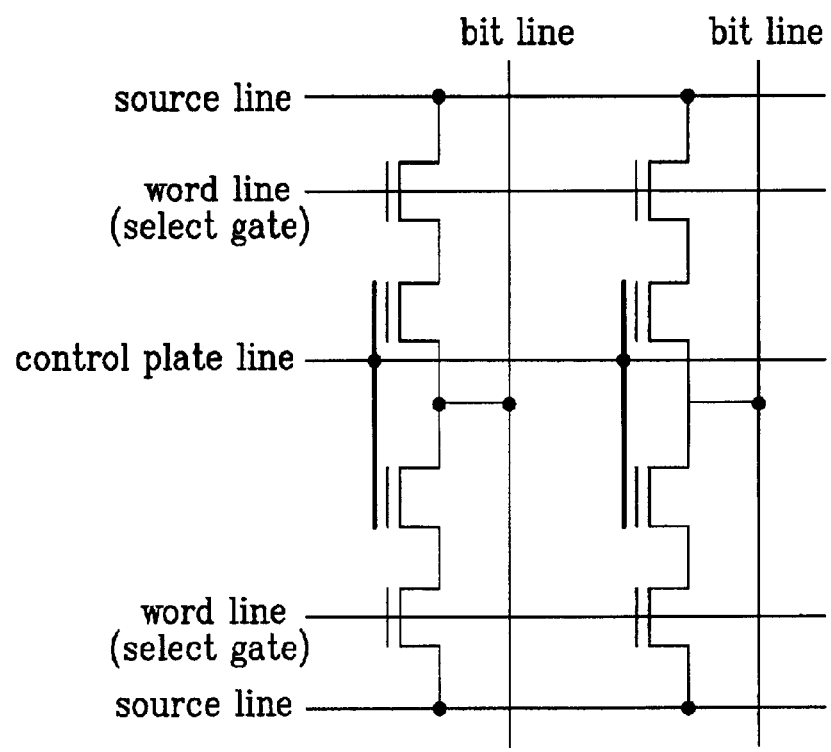

FIGS. 7A and 7B illustrate structures of a unit block and an array of a non-volatile semiconductor memory according to a third embodiment of the present invention. FIG. 7C illustrates a table for operating conditions for the non-volatile semiconductor memory in the flash memory mode according to the third embodiment of the present invention.

The structures of the third embodiment of the present invention including a control gate are similar to those of the first embodiment of the present invention except that sources and drains of the respective cells are switched. Therefore, the drains of the cells become those of storage transistors while the sources of the cells become those of selection transistors.

Each unit cell 72 includes a selection transistor 71 and a non-volatile storage transistor 70 connected to the selection transistor 71 in series so as to construct a two-transistor structure.

The selection transistor 71 comprises a selection gate 76 to select or disconnect the corresponding non-volatile storage transistor 70, and terminals of source and drain 75 and 74.

More specifically, the non-volatile storage transistor 70 comprises a control plate 78 built in a single body shared with the adjacent cell, a terminal of a common drain 73, and the terminal of the source 74, in which the drain 74 of the selection transistor 71 and the terminal of the source 74 of the non-volatile storage transistor 70 are constructed with one terminal.

In this case, drains of the two adjacent cells construct a common drain terminal.

As mentioned in the foregoing explanation, the non-volatile storage transistors 70 of the adjacent two cells are connected to each other through one control plate 78. Each of the cells includes a corresponding portion of the control plate 78, a channel in the substrate below the corresponding portion of the control plate 78, source and drain regions formed at both sides of the channel, and a non-volatile storage 77 below the corresponding part to control a conductivity of the channel.

An array in FIG. 7B is similar to that of the first embodiment shown in FIG. 3B except for that drains of storage transistors are connected to bit lines.

FIG. 7C is a table for operating conditions in a flash mode operation according to the third embodiment of the present invention.

Conditions for a programming operation are similar to the second embodiment of the present invention. However, since the selection gate is located at the source side, a word line voltage applied to a selection gate may be lower than that of the first embodiment.

While a reading or programming operation is carried out, a voltage Vs of 0~2V is always applied to a source line and an unselected bit line and a voltage of 2~7V or 0.5~2V is applied to a bit line of a selected cell for the programming or reading operation.

An erasing operation is carried out in a manner that electric charges are discharged by applying a voltage of (−)10~(5)V to a control plate and a voltage of 0~8V to a selected bit line or cells on the same bit line are erased through tunneling by applying a voltage of 8~13 to the selected bit line.

Moreover, cells on the selected word line are just erased by applying a voltage of Vcc~10V to a selection gate to turn on a selection transistor, a voltage of Vcc~10V to a source line, and a voltage of (−)10~(−)3V to a control plate, respectively.

In case of using a triple-well structure, the triple-well conditions of FIG. 7C may be applied to the operation and the reading operation is carried out by the same conditions of the first embodiment of the present invention.

A layout and cross-sectional structures of a non-volatile semiconductor memory according to the third embodiment of the present invention are explained as follows.

Figure 7D:
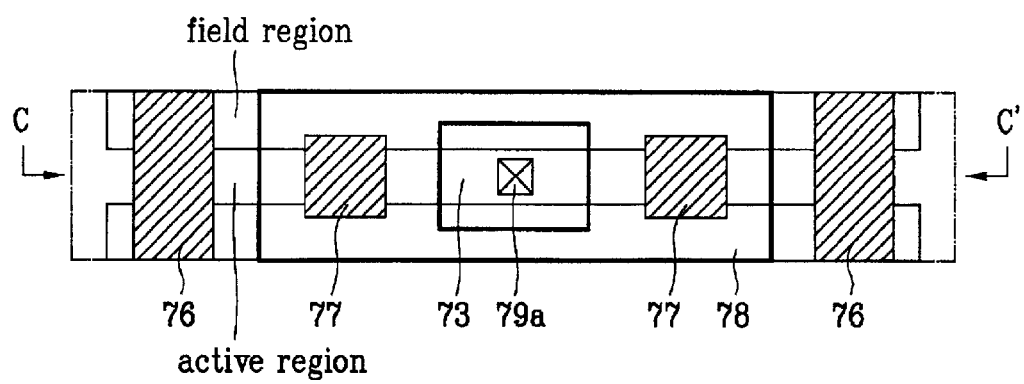
FIG. 7D illustrates a layout of the non-volatile semiconductor memory according to the third embodiment of the present invention.

FIG. 7D illustrates a layout of the non-volatile semiconductor memory according to the third embodiment of the present invention.

Figure 7E:
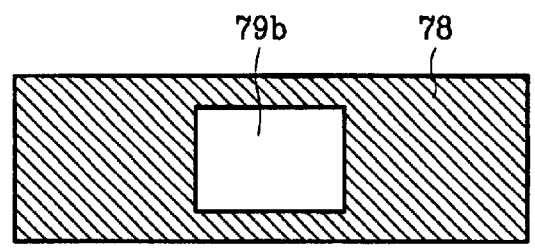
FIG. 7E illustrates a structure of a control plate in a bit line contact region in FIG. 7D.
Figure 7F:
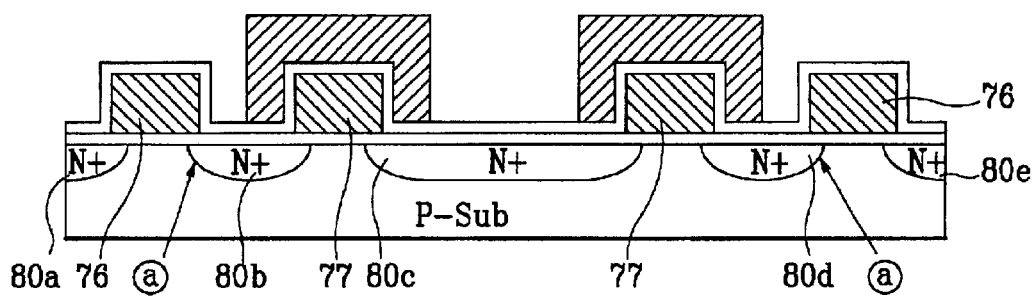
FIG. 7F illustrates a cross-sectional view in accordance with line C–C' in FIG. 7D.

FIG. 7E illustrates a structure of a control plate in a bit line contact region in FIG. 7D, and FIG. 7F illustrates a cross-sectional view in accordance with line C–C' in FIG. 7D.

As shown in FIGS. 7D to 7F, two cells are arranged symmetrically to locate at both sides of a common drain region 73. Active regions of the cells are isolated each other by field isolation regions. On each of the active regions, a storage 77 and a selection gate 76 are arranged in series. Source/drain regions 80a to 80e are formed at both lateral sides of the storage 77 and the selection gates 76.

The common drain 73 or 80C of the two cells is connected to a bit line through a contact junction part 79a, while the source regions 80b and 80d form source lines in a direction perpendicular to the bit line.

A control plate 78 of the cell according to the present invention is constructed with one plate covering the storage 77 of the two adjacent cells. A drain contact of the cells is located between a pair of the storage 77 adjacent to each other. Therefore, as shown FIG. 7E, a hole 79b for a contact region is formed in the middle of the control plate 78.

Explanation of a non-volatile semiconductor memory according to a fourth embodiment of the present invention is described as follows.

Figure 8A:
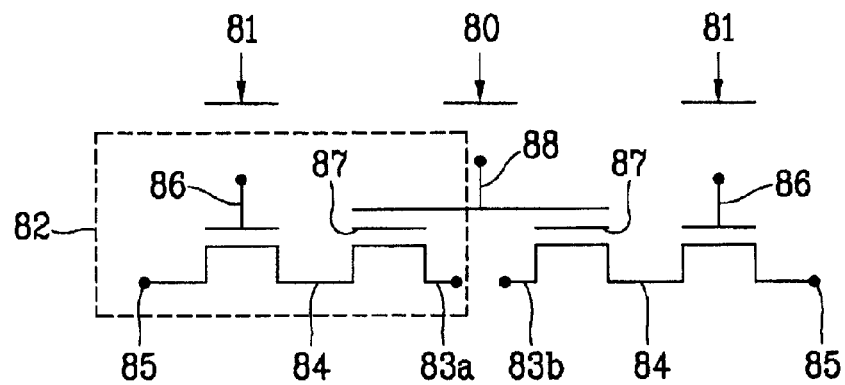
FIGS. 8A and 8B illustrate structures of a unit block and an array of a non-volatile semiconductor memory according to a fourth embodiment of the present invention.
Figure 8B:
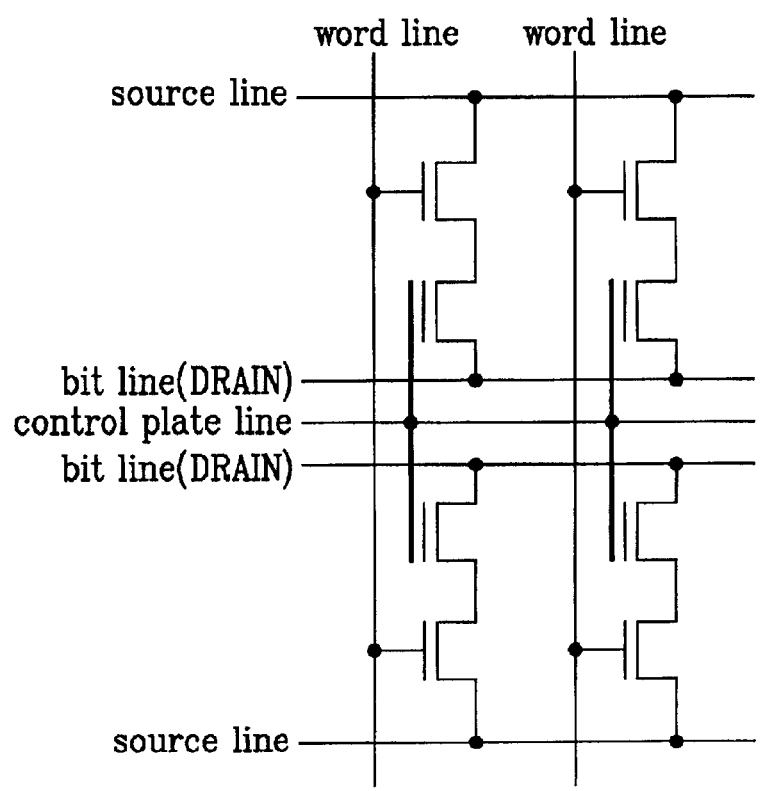

FIGS. 8A and 8B illustrate structures of a unit block and an array of a non-volatile semiconductor memory according to a fourth embodiment of the present invention.

A fourth embodiment of the present invention using a two-transistor structure is similar to the third embodiment of the present invention shown in FIG. 7A except for that drains of cells are separated from each other.

Each cell 82 has two-transistors including a selection transistor 81 and a non-volatile storage transistor 80 connected in series to the selection transistor 81.

The selection transistor 81 of each of the non-volatile memory cells comprises a selection gate 86 selecting or disconnecting the corresponding non-volatile storage transistor 80, a terminal of a source 85, and a terminal of a drain 84.

More specifically, the non-volatile storage transistor 80 comprises a control plate 88 built in a single body shared with the adjacent cell, separated terminals of drains 83a and 83b, and a terminal of a source 84, in which the drain 84 of the selection transistor 81 and the terminal of the source 84 of the non-volatile storage transistor 80 are constructed as one common terminal.

As mentioned in the foregoing explanation, the non-volatile storage transistors 80 of the adjacent two cells are connected to each other through one control plate 88. Each of the cells includes a corresponding portion of the control plate 88, a channel in the substrate below the corresponding portion of the control plate 88, source and drain regions located at both sides of the channel, and a non-volatile storage 87 below the corresponding portion of the control plate 88 to control a conductivity of the channel.

FIG. 8B shows an array structure of the fourth embodiment of the present invention, in which drains are separated into two parts from the array of the second embodiment of the present invention. Therefore, operational conditions are identical to those of FIGS. 6C and 6D.

The array according to the fourth embodiment of the present invention includes a plurality of control plate lines arranged in a row direction so as to traverse central parts between two adjacent cells, a plurality of bit lines arranged in the row direction wherein each pairs of the bit lines is located in parallel with and at both sides of the corresponding control plate lines, a plurality of word lines arranged in a column direction, a plurality of source lines arranged in the row direction wherein at least one storage transistor and at least one selection transistor corresponding to the storage transistor are placed between the corresponding bit and source lines, and a plurality of non-volatile memory unit blocks between the lines.

In this case, each of the unit blocks includes at least one storage transistor having a non-volatile storage on a corresponding channel region wherein a drain electrode of the storage transistor is connected to the bit line and at least one selection transistor connected to the corresponding storage transistor in series wherein gate and drain of the selection transistor are connected to the corresponding word and source lines, respectively.

Each of the unit blocks further includes a control plate connected to the corresponding control plate line and having an opening at the central part where the control plate is built in a single body over the upper part of the corresponding non-volatile storage of the storage transistor so as to have a dielectric therebetween.

In the above-explained first to fourth embodiments, channels of the selection and non-volatile storage transistors are separated form each other by the junction parts. In other words, two independent transistors are connected to each other in series.

A non-volatile semiconductor memory having a split-gated structure according to a fifth embodiment of the present invention will be described as follows, in which a selection gate and a gate of a storage transistor are arranged on a continuous channel for the split-gated structure.

Figure 9A:
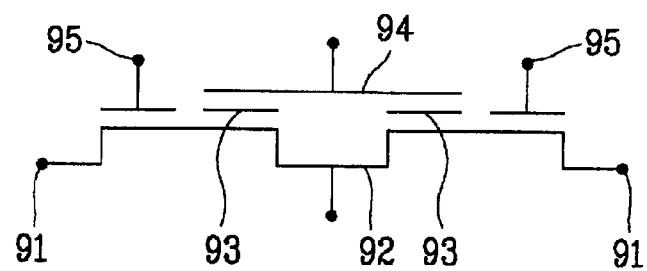
FIGS. 9A and 9B illustrate structures of a unit block and an array of a split-gated non-volatile semiconductor memory according to a fifth embodiment of the present invention.
Figure 9B:
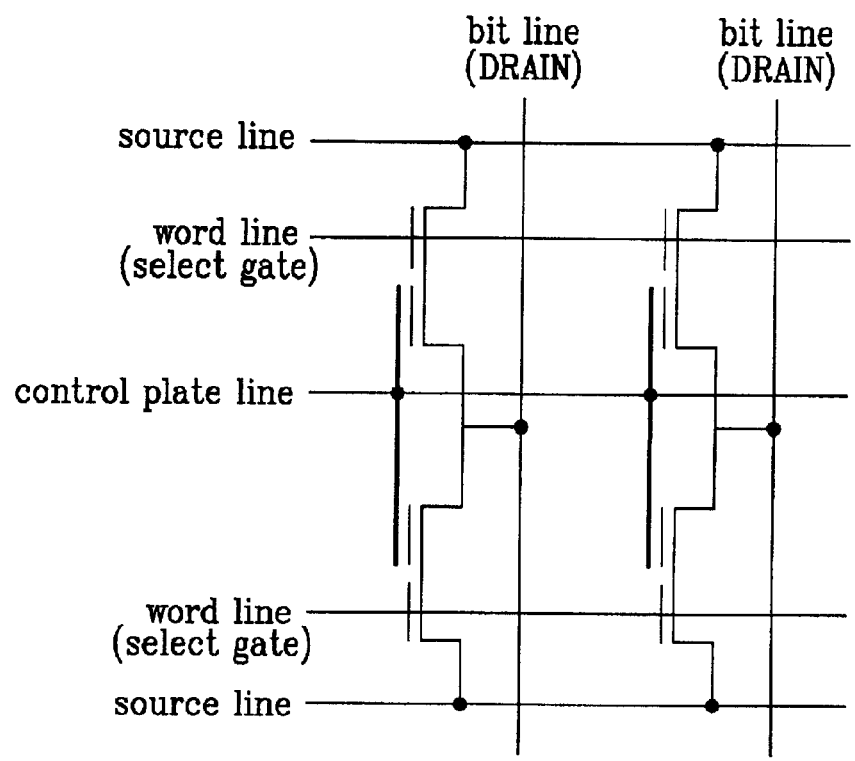

FIGS. 9A and 9B illustrate structures of a unit block and an array of a split-gated non-volatile semiconductor memory according to the fifth embodiment of the present invention.

FIG. 9C illustrates a table for operating conditions for the non-volatile semiconductor memory in a flash memory mode according to the fifth embodiment of the present invention.

The fifth embodiment according to the present invention, as shown in FIG. 9A, includes two adjacent cells are connected symmetrically to each other, in which each cell has a terminal of a source 91 and a terminal of a drain 92 shared by the two adjacent cells.

Moreover, a non-volatile storage transistor of each of the cells has an electric charge storage 93 such as a floating gate or a dielectric. A control plate 94 controlling each of the electric charge storage transistors is built in a single body extended across the two adjacent cells.

A selection gate 95 is arranged in parallel with the electric charge storage 93 over a channel region extended continuously from a channel region of the non-volatile storage transistor of each of the cells.

In this case, a ratio between the channel regions of the electric charge storage 93 and the selection gate 95 is variable.

FIG. 9B represents the array structure of FIG. 9A, in which a source of each of the cells is connected to a source line in a direction perpendicular to a channel, a common drain of the two adjacent cells is connected to a bit line in a channel direction, and a selection gate of each of the cells is connected to a word line perpendicular to the bit line.

A control plate hanging across the two adjacent cells is connected to a control plate line in parallel with the word line.

FIG. 9C is a table for operating conditions of the cell, in which a programming operation may use a so-called source side injection method.

A storage transistor is turned on by applying a voltage of 2~8V to a drain of a selected cell and a voltage of (−)5~10V to a control plate in accordance with a status of the storage transistor. An electric field generated from a voltage difference between both ends of the drain and source is formed in a channel region between the storage and selection transistors by applying a voltage slightly higher than the threshold voltage of the selection transistor to a selection gate and a voltage of 0~2V lower than that of the drain to the source. Then, hot electrons generated from the channel region are injected into a floating gate (or a storage) by a vertical electric field formed by the control plate.

In an erasing operation, a strong electric field is formed between a storage and a drain by applying 0V to a selection gate of a selected cell, a negative voltage of (−)10~(−)5V to a control plate, and a positive voltage of 0~8V to a common drain. Therefore, the erasing operation is accomplished by "tunneling" through a drain terminal.

Instead, for the erasing operation, electric charges may be removed through a drain terminal only with a positive voltage by applying 0V to the selection gate and the control plate in the selected cell and a voltage of 7~13V to the drain terminal.

In the above two methods for the erasing operation, a gate oxide layer of the storage transistor is formed of a tunneling oxide layer.

As a third method for the erasing operation, a tunneling region is formed between the selection and floating gates and electric charges in the floating gate are removed through the tunneling region. In this method, the electric charges are discharged through the tunneling region by applying voltages of Vcc~20V and (−)8~0V to the selection gate and the control plate, respectively.

In this case, both negative and positive voltages may be used by properly adjusting a distribution of the voltages applied to both gates. Alternatively, only a positive voltage may be used.

Moreover, if a coupling ratio between the common drain and floating gate is sufficiently high so that a ground or a positive voltage applied to the drain is helpful for the erasing operation, a ground or a proper positive voltage may be applied in accordance with the coupling ratio to the drain terminal.

A layout and cross-sectional structures of the non-volatile semiconductor memory are explained as follows.

FIG. 9D illustrates a layout of the non-volatile semiconductor memory according to the fifth embodiment of the present invention.

FIG. 9E illustrates a layout of a control plate in FIG. 9D, and FIGS. 9F to 9H illustrate cross-sectional views along with lines D–D', E–E', and F–F' in FIG. 9D.

The fifth embodiment according to the present invention relates to two adjacent cells arranged symmetrically with each other.

A floating gate (or electric charge storage) 93 of each cell is arranged on an active region. A control plate 94 built in a single body covers the floating gates 93 of the two adjacent cells. In this case, a dielectric is inserted between the floating gates 93 and the control plate 94.

A common drain region 92 shared by the two adjacent cells is formed between the floating gates 93 below the middle part of the control plate 94. A hole 97 for a contact with a bit line 98 is formed at the central part of the control plate 94 over the common drain region 92.

FIG. 9E shows a layout of the control plate 94, in which the hole 97 is formed to secure a region for electrically connecting the common drain region 92 to the bit line 98.

Plug layers 99a and 99b are formed in the hole 97 so as to connect the common drain region 92 with the bit line 98.

Moreover, in the fifth embodiment of the present invention, a selection gate 100 of each two adjacent cell is arranged next to the corresponding floating gate 93 on an active region continuously adjacent to an active region of a storage transistor. A source diffusion region 91 of each of the two adjacent cells is formed to be adjacent to the corresponding selection gate 100.

In this case, a portion of the hole over the common drain region 92 is filled with a conductive material (e.g. polysilicon) 99a, which is the same material as the selection gate 100, so as to be electrically contacted with the common drain region 92 as well as isolated from the adjacent floating gate 93 and control plates 94. Successively, a contact plug layer 99b for the bit line 98 is formed on the conductive layer 99a.

Such a structure increases a process margin between the contact, floating gate 93, and control plate 94, thereby reducing a cell size.

In the cells, a dielectric is inserted between a substrate and the respective gates.

Such a non-volatile semiconductor memory of the split-gated structure according to the fifth embodiment of the present invention may be modified to another structure.

Figure 10A:
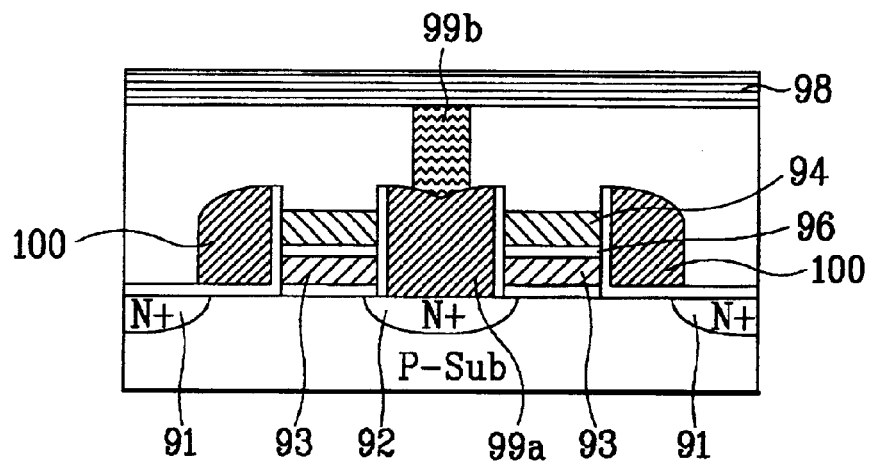
FIGS. 10A and 10B illustrate modified cross-sectional views of the non-volatile semiconductor memory according to a fifth embodiment of the present invention.
Figure 10B:
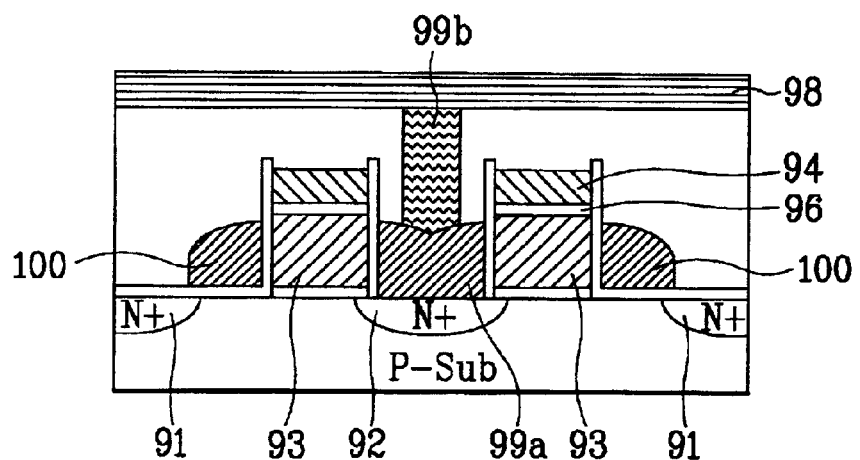

For example, FIGS. 10A and 10B illustrate modified cross-sectional views of the non-volatile semiconductor memory according to the fifth embodiment of the present invention.

Figure 9F:
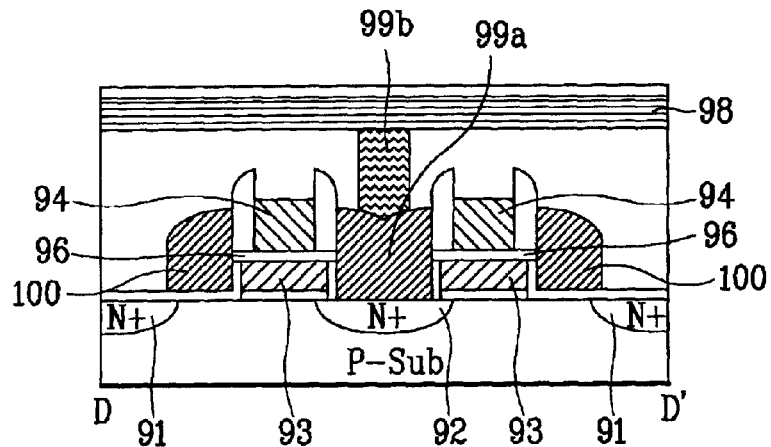
FIGS. 9F to 9H illustrate cross-sectional views along with lines D–D', E–E', and F–F' in FIG. 9D.
Figure 9G:
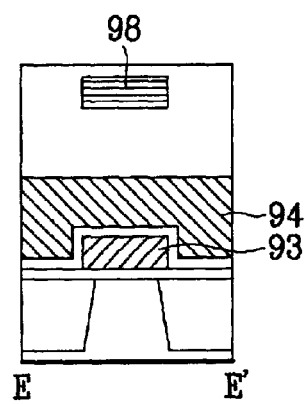
Figure 9H:
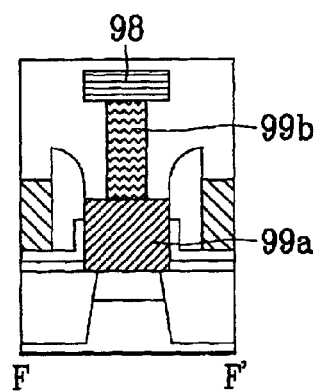

The structure shown in FIG. 10A is similar to that shown in FIG. 9F except for spacers at the lateral sides of the control plate.

In this case, a fabrication method may be simplified by excluding a step of forming the spacers.

Compared to the structure in FIG. 10A, a structure in FIG. 10B is characterized in that floating gates are thicker than selection gates. Therefore, a coupling ratio between the floating gate and selection gate/drain is increased, thereby reducing an applying voltage to a control plate.

Two adjacent cells are taken in the above-described embodiments. Alternatively, at least four cells may also be used in the present invention. Accordingly, at least two adjacent or non-adjacent four cells may be applicable in the present invention.

Figure 11A:
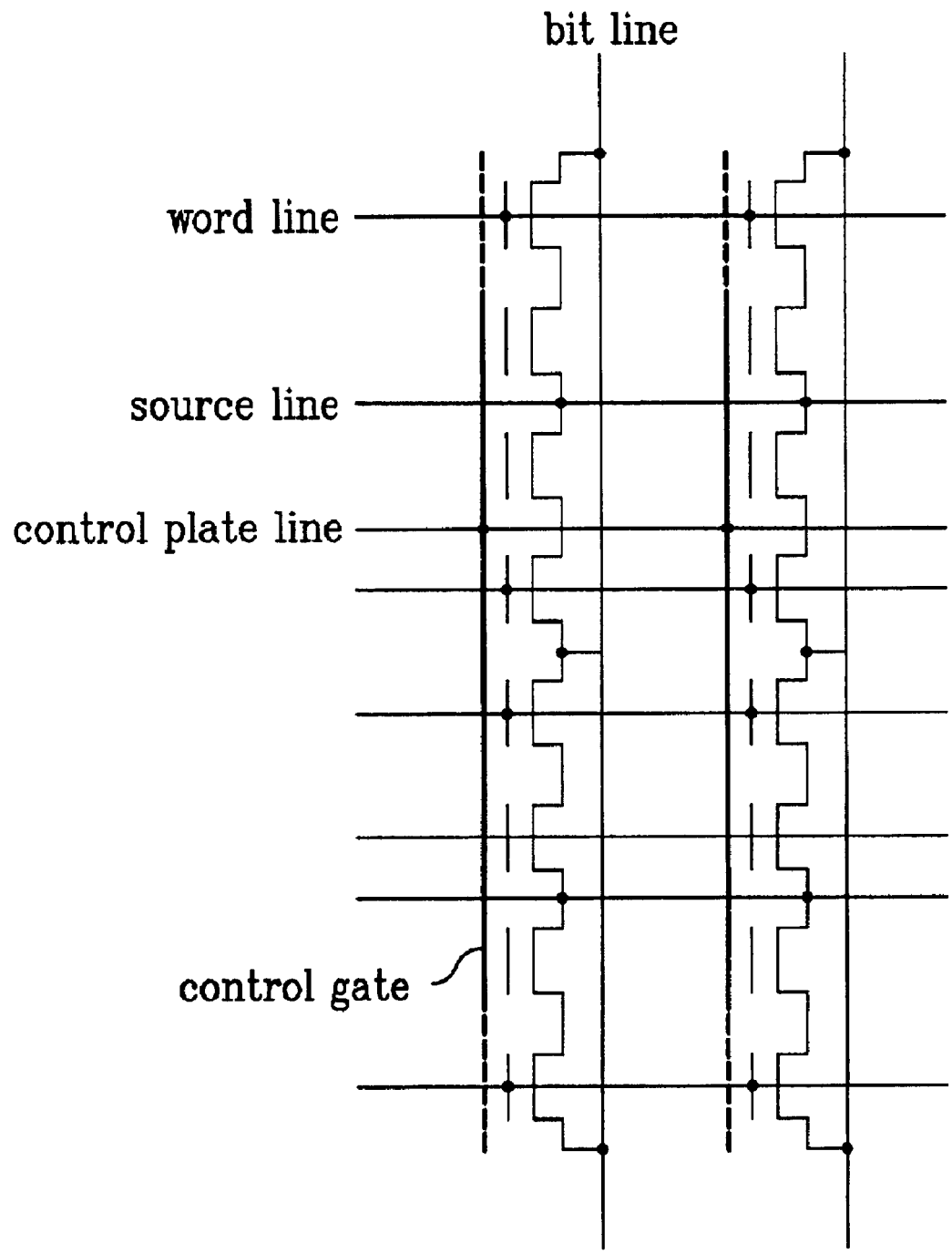
FIG. 11A illustrates a constructional circuit of a control plate cell covering four or more cells.
Figure 11B:
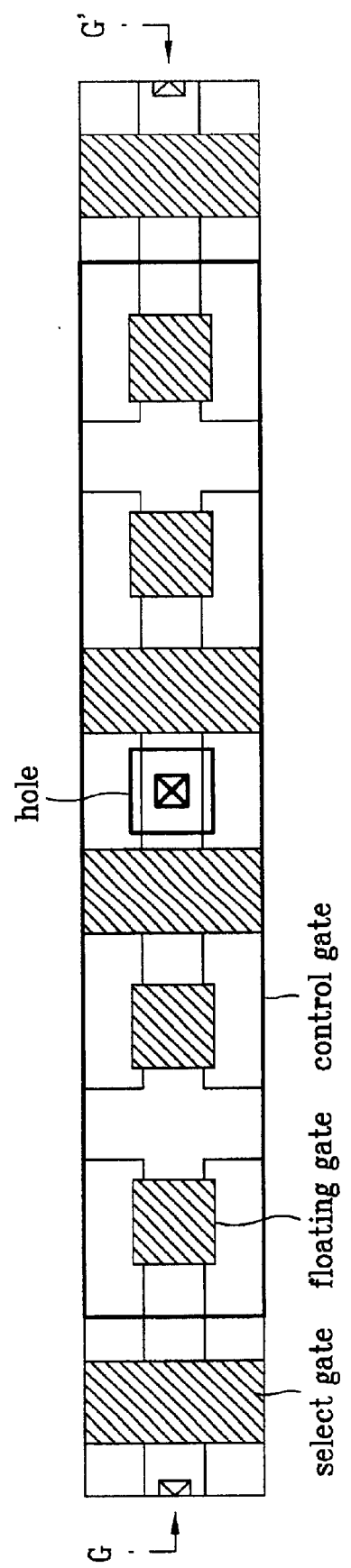
FIG. 11B illustrates a layout of a control plate cell covering four or more cells.
Figure 11C:
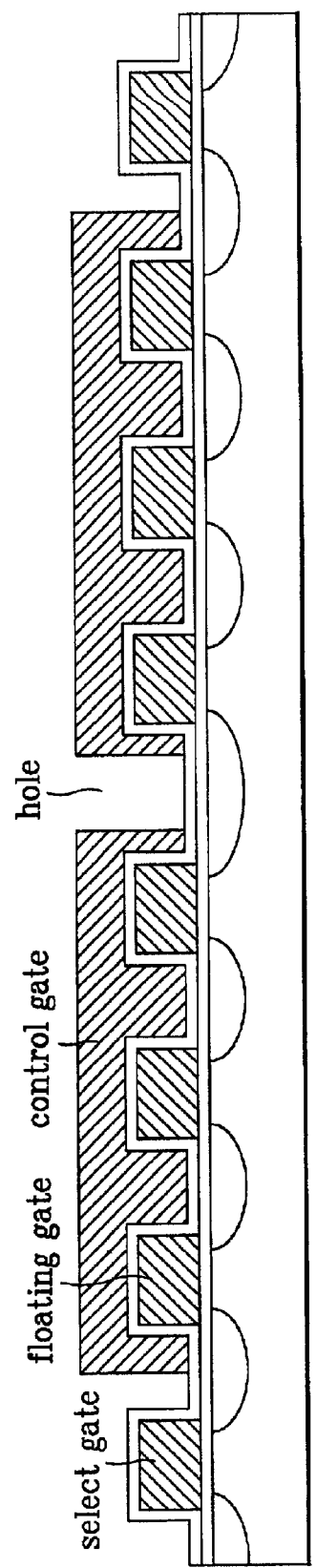
FIG. 11C illustrates a cross-sectional view in accordance with line G–G' in FIG. 11B.

FIG. 11A illustrates a constructional circuit of a control plate cell covering four or more cells. FIG. 11B illustrates a layout of a control plate cell covering four or more cells. FIG. 11C illustrates a cross-sectional view in accordance with line G–G' in FIG. 11B.

FIG. 11A shows that four consecutive cells are covered by one control plate. Thus, the present invention is applicable to more than four cells.

FIG. 11A is one embodiment that the array in FIG. 3B is repeated twice in the bit line direction so as to realize a matrix of a non-volatile memory. Such a method for forming a control gate over at least four cells is applied to other embodiments explained in the foregoing description.

Operating methods in the non-volatile memory matrix are similar to those of the corresponding above-explained embodiments.

FIGS. 11B and 11C show repetitions of the layout and cross-sectional view of FIGS. 4A and 4B in the bit line direction, in which a control plate is built in a single body across four cells. Accordingly, such a method enables to realize a larger sized matrix.

For realizing the matrix, regions demanding contacts are formed in a manner that holes are formed in the control plates so as to provide the contacts through the holes with the corresponding lines.

Other examples and the description are the same as those in FIGS. 4A to 4C. Thus, detailed description will be omitted for a simplicity.

Such a method of forming a control plate for at least four cells is also applied to the foregoing other embodiments.

All embodiments so far have described NMOS transistors on a P-type substrate, which are applicable to PMOS cells as well since either polarity of transistors can be used in the present invention.

As described above, a control plate of a two-transistor cell is formed with a single plate covering two adjacent cells, at least two floating gates, or electric charge storage.

Thus, a common source region of the two adjacent cells is defined when the left and right floating gates are formed. The control plate over the floating gates is formed as a single plate so as not to be separated from each cell. Accordingly, the present invention minimizes the source region up to the photolithographic limit.

Moreover, a control plate may be formed with its edge located between the floating and selection gates, on the upper parts of the selection gates or covering the selection gates. Thus, a process of forming the control plate can be performed regardless of the process tolerance in photolithography.

Accordingly, the present invention provides a very small-sized cell having a two-transistor structure.

Moreover, since a plurality of control gate lines are replaced by one control plate line, the number of control lines is reduced in the present invention. Therefore, a circuit for decoding the control lines is simplified and an area occupied by the circuit is reduced.

A two-transistor cell according to the present invention is free from problems such as "drain-turn-on" caused by a drain voltage applied to an unselected cell at the same bit line in a single transistor cell, "punch-through", "leakage current", and "electric field stress" applied to an electric charge storage. Therefore, the present invention enables to decrease a channel length of the non-volatile storage transistor. Thus, much smaller channel length is achieved than that of a single transistor.

Accordingly, the present invention provides a very small-sized cell despite having a two-transistor structure.

Such an advantage according to the present invention becomes more important as the design rule of a device becomes further reduced. In the single transistor cell, such problems become more serious as the design rule becomes scaled-down so that a scale-ability of the cell size becomes problematic. Two-transistor EEPROM according to a related art has a relatively large cell size due to high voltage junction and the process for separating control gates. Those limiting factors in scaling-down the cell size of EEPROM become more serious as the design rule becomes further reduced.

Moreover, in a cell according to the present invention, the control plate surrounds the lateral and upper surfaces of a floating gate as well as an area between the control plate and floating gate is increased by increasing a height of the floating gate sufficiently, thereby providing a large capacitance. Therefore, the present invention guarantees a relatively large control gate coupling ratio.

The control gate coupling ratio is determined by a capacitance between the floating and control gates over a total capacitance connected to the floating gate. As the control gate coupling ratio becomes larger, a voltage applied to the control gate is more transferred to the floating gate.

A high coupling ratio reduces a level of a boosted voltage for programming and erasing operations as well as provides a large cell current despite a low Vcc input voltage in a reading operation. Therefore, a cell according to the present invention is advantageous for operations with a low voltage and a low power.

The cell according to the present invention improves reliability and productivity as well. The cell according to the present invention is free from a disturbance phenomenon, generated from a single transistor flash memory, caused by a drain voltage during a programming operation and an over-erasing phenomenon during an erasing operation. In the cell according to the present invention, a process-induced damage to a tunneling oxide, is removed because a control plate surrounds a floating gate and a tunneling oxide layer. Thus, a dielectric degradation occurring in the process of forming metal lines is eliminated in the present invention.

Moreover, the cell according to the present invention has an operational voltage lower than that of EEPROM according to a related art, thereby reducing a malfunction caused by a high voltage. Accordingly, the present invention improves stability, reliability, and productivity.

The cell according to the present invention is operated in a depletion mode by extending a programmed threshold voltage of the non-volatile storage transistor to the range below 0V. Therefore, the present invention has a wide range of the threshold voltage and a large cell current, thereby enabling a high-speed reading operation with a low supply voltage Vcc.

Moreover, the cell according to the present invention is advantageous to realize a high-speed multi-bits cell due to the wide available range of the threshold voltage and the high reliability. When the multi-bits are realized in the conventional art, reading and writing speed of a memory becomes slower.

This is mainly because of the narrow available range of the threshold voltage limited over 0V. Accordingly, the cell according to the present invention has an advantage in realizing a high speed, which is equal to or faster than that of a single bit memory, for a multi-bits memory.

Meanwhile, logic cores such as MCU, DSP and the like, analog circuits, volatile memories such as SRAM, DRAM, and non-volatile memories such as flash memory and EEPROM and the like are incorporated entirely or in part on a single chip so as to realize a system-on-chip (SoC). It is well known that such a system-on-chip is superior to a system incorporated with separate chips in speed, power consumption, and PCB area.

In implementing SoC, a problem lies on the process of combining a non-volatile memory (embedded non-volatile memory) with a logic process.

An embedded non-volatile memory fabricated by the same process on a logic process calls for simplicity and scale-ability according to a down-scaled design rule of the logic process.

Moreover, the embedded non-volatile memory requires a lowered operational voltage as an internal boost voltage according to a low-voltage logic device, a reading operation by a low supply voltage Vcc, a process of fabricating a logic device and a competitive flash memory/EEPROM simultaneously, and high reliability and productivity. The cell according to the present invention provides for the demands for SoC as described above.

Accordingly, the cell according to the present invention has many advantages in realizing an embedded non-volatile memory for the next-generation ultra-highly integrated circuit SoC as well as a stand-alone non-volatile memory.

It will be apparent to those skilled in the art that various modifications and variations can be made in the non-volatile semiconductor memory and a method of operating the same of the present invention without departing from the spirit or scope of the inventions. Thus, it is intended that the present invention covers the modifications and variations of this invention provided they come within the scope of the appended claims and their equivalents.

What is claimed is:

1. A non-volatile semiconductor memory comprising:
    a semiconductor substrate having active and field regions;
    at least two non-volatile storage transistors each having a storage at the active region and a control gate at the storage, wherein each control gate is incorporated into a single control plate; and
    at least two selection transistors, each of which is connected to a corresponding one of the non-volatile storage transistors for selecting the corresponding non-volatile storage transistor, and wherein each selection transistor is connected in series to the corresponding non-volatile storage transistor through a PN-junction shared by the selection transistor and the corresponding non-volatile storage transistor.

2. The memory of claim 1, wherein the semiconductor substrate is a triple well type having an N-type well on a P-type substrate and a P-type well in the N-type well, wherein each of the active regions is formed in the P-type well.

3. The memory of claim 1, wherein the selection transistor is connected in series to the corresponding non-volatile storage transistor through a common channel.

4. The memory of claim 1, further comprising a plurality of dielectric layers at the non-volatile storage and the selection transistors, wherein each dielectric layer is formed of different materials or has different thickness.

5. The memory of claim 1, wherein the storage is a conductive floating gate.

6. The memory of claim 4, wherein the dielectric layers at the non-volatile storage transistors are formed of a tunneling oxide.

7. The memory of claim 1, further comprising:
    a first dielectric layer between the storage and the substrate; and
    a second dielectric layer between the substrate and the selection gate.

8. The memory of claim 1, wherein each of the storage is formed of a conductor.

9. The memory of claim 1, wherein each of the storage is one of a nitride layer, a nitride/oxide layer, and an oxide/nitride/oxide layer.

10. The memory of claim 9, wherein each of the storage is formed on the non-volatile storage transistor only.

11. The memory of claim 1, wherein the storage is formed of a ferroelectric material.

12. The memory of claim 1, wherein the at least two non-volatile storage transistors have at least one common impurity region for a source or a drain in the substrate.

13. A non-volatile semiconductor memory comprising:
    a semiconductor substrate having active and field regions;
    a dielectric layer on the substrate;
    at least two non-volatile storage transistors on the substrate, each non-volatile storage transistor including a source and a drain in the substrate, a storage over the active region, and a control gate at the storage, wherein each control gate is incorporated into a single control plate and the source is shared by adjacent non-volatile storage transistors as a common source; and at least two selection transistors on the substrate, each selection transistor including a source and a drain in the substrate, a selection gate on the dielectric layer between the source and the drain, wherein the source of each of the selection transistors acts as the drain of the corresponding non-volatile storage transistor, and each of the two selection transistors is connected to the corresponding non-volatile storage transistor for selecting the corresponding non-volatile storage transistor.

14. The memory of claim 13, wherein each of the sources of the selection transistors includes first and second sources, wherein the second source is formed in the first source and a programming operation is carried out through the first source, the storage of the corresponding non-volatile storage transistor, and the dielectric layer, and an erasing operation is carried out through the second source, the storage, and the dielectric layer.

15. The memory of claim 13, wherein the programming operation is carried out using a hot carrier injection.

16. The memory of claim 13, wherein the dielectric layer includes a first portion having a first thickness between the storage and the semiconductor substrate and a second portion having a second thickness different from the first thickness between the selection gate and the semiconductor substrate.

17. A non-volatile semiconductor memory array, comprising:

a plurality of bit lines arranged in a column direction;
a plurality of word lines arranged in a row direction;
a plurality of source lines arranged in the row direction;
a plurality of control plate lines arranged in the row direction; and
a plurality of non-volatile memory cells between the lines, each of the non-volatile memory cells includes,
    at least two non-volatile storage transistors each of which includes a source and a drain in a substrate, a drain formed in the substrate, a storage over the active region, and a control gate at the storage, wherein each control gate is incorporated into a control plate built in a single body and the source is shared by adjacent non-volatile storage transistors as a common source, and
    at least two selection transistors each of which includes a source and a drain in the substrate, a selection gate on the dielectric layer between the source and drain so as to be isolated from the storage, wherein the source of each of the selection transistors is the drain of the corresponding non-volatile storage transistor, and each of the two selection transistors is connected to the corresponding non-volatile storage transistor for selecting the corresponding non-volatile storage transistor, and selection gates of the respective cells are connected to the corresponding word lines in the row direction, the common source of a unit cell is connected to the corresponding source line extending in the row direction, the control plate is connected to the corresponding control plate line in the row direction, and the drain of the selection transistor in the cell is connected to the corresponding bit line.

18. The array of claim 17, wherein the control plate lines and word lines are formed of the same conductive materials as the control plate and the selection gate, respectively.

19. The array of claim 17, wherein the array is operated in a flash memory mode.

20. The array of claim 19, wherein the selection gate of an unselected non-volatile storage transistor in the array is applied with 0V, grounded or floated, and the selection gate of a selected non-volatile storage transistor is applied with Vcc~10V for a programming operation, the selection gate of the selected non-volatile storage transistor is applied with Vcc~7V for a reading operation, the control plate of the selected non-volatile storage transistor is applied with (−)7V~10V, (−)13V~0V, and 0V~7V for the programming operation, an erasing operation, and the read operation, respectively, a drain of the selected non-volatile storage transistor is applied with 1V~6V and 0.5V~2V for the programming operation and the reading operation, respectively, the common source of the selected non-volatile storage transistor is applied with 0V~2V, 0V~13V and 0V~1.5V for the programming, erasing, and reading operations, respectively, and the substrate is a P-type substrate.

21. The array of claim 19, wherein the selection gate of an unselected non-volatile storage transistor is applied with 0V, grounded or floated, and the selection gate of a selected non-volatile storage transistor is applied with Vcc~40V, Vcc~7V, and 0V~13V for programming, reading, and erasing operations or the selection gate of the selected non-volatile storage transistor is floated for the erasing operation, the control plate of the selected non-volatile storage transistor is applied with (−)7V~10V, (−)13V~0V, and 0V~7V for the programming, erasing, and reading operations, respectively, the drain of the selected non-volatile storage transistor is applied with 1V~6V, 0.5V~2V for the programming and reading operations, respectively, the common source of the selected non-volatile storage transistor is applied with 0V~2V, Vcc~13V, and 0V~1.5V for the programming, erasing, reading operations, respectively, or the common source of the selected non-volatile storage transistor is floated for the erasing operation, the substrate includes a P-type substrate, an N-type well formed in the P-type substrate, and a P-type well formed in the N-type well, 0V is always applied to the P-type substrate, (−)5V~0V and Vcc~13V are applied to the P-type well for the programming and erasing operations, respectively, and 0V is applied to the N-type well for the programming and reading operations, and Vcc~13V is applied to the N-type well for the erasing operation.

22. The array of claim 17, wherein the array operates in an EEPROM mode of a cell unit.

23. The array of claim 22, wherein a selection gate of an unselected cell is applied with 0V, 0~Vcc or float, and 0V for programming, erasing, and reading operations, respectively, the drain of the selection transistor for the unselected cell is applied with 0V or float for the erasing operation, the selection gate of the selected cell is applied with Vcc~10V, Vcc~10V or 7V~15V, and Vcc~7V for the programming, erasing, and reading operations, respectively, the drain of the selection transistor for the selected cell is applied with 2V~7V, Vcc~10V or 7V~13V, and 0.5V~2V for the programming, erasing, and reading operations, respectively, the control plate of the selected cell is applied with (−)7V~10V, (−)10V~(−)3V or 0V, and 0V~7V for the programming, erasing, and reading operations, respectively, the common source for the selected cell is applied with 0V~2V, 0V or float, and 0V~1.5V for the programming, erasing, and reading operations, respectively, and the substrate is a P-type substrate.

24. The array of claim 22, wherein the selection gates of unselected and selected cells are applied with 0V and Vcc~10V for a programming operation, the control gate of the selected cell is applied with (−)7~10V, the drain of the selection transistor for the selected cell is applied with 1~6V, and the common source of the selected cell is applied with 0~2V for the programming operation, the substrate includes a P-type substrate, an N-type well in the P-type substrate, and a P-type well in the N-type well, 0V is always applied to the substrate, and (−)5V~0V and 0V are applied to the P-type and N-type wells for the programming operation, respectively.

25. In a non-volatile semiconductor memory including at least two non-volatile storage transistors each of which including a source in the substrate, a drain in the substrate, a storage on the dielectric layer over the active region, and a control gate at the storage, at least two control gates incorporating into a control plate built in a single body, and at least two selection transistors each of which including a source in the substrate, a drain in the substrate, a selection gate on the dielectric layer between the source and the drain to be isolated from the storage, wherein the source of each of the selection transistors is the drain of the corresponding non-volatile storage transistor, and each of the two selection transistors is connected to the corresponding non-volatile storage transistor for selecting the corresponding non-volatile storage transistor, a method of operating the non-volatile semiconductor memory, comprising:

selecting one of the non-volatile storage transistors by turning on or off the respective selection transistors; and programming the selected non-volatile storage transistor using a hot carrier injection method generating hot electrons from a channel of the selected non-volatile storage transistor.

26. The method of claim 25, wherein the hot carrier injection method includes one of a first method of applying a reverse bias between the source of the selected non-volatile storage transistor and the substrate, a second method of increasing a voltage of the control plate of the selected non-volatile storage transistor gradually from a low voltage, and a third method of combining the first and second methods.

27. The method of claim 25, further comprising:
monitoring a channel current of the selected non-volatile storage transistor for a voltage applied to the control plate of the selected non-volatile storage transistor; and
terminating a programming operation of the voltage applied to the control plate when the channel current reaches a reference current for the voltage.

28. The method of claim 25, further comprising:
monitoring a channel current of the selected non-volatile storage transistor for voltages applied successively to the control plate of the selected non-volatile storage transistor; and
terminating programming operations of the respective voltages applied to the control plate when the channel current reaches a reference current for the voltages applied to the control plate.

29. The method of claim 25, further comprising:
monitoring a channel current of the selected non-volatile storage transistor for voltages applied successively to the control plate of the selected non-volatile storage transistor; and
terminating programming operations of the respective voltages applied to the control plate when the channel current reaches a reference current for the voltages applied to the control plate, respectively.

30. The method of claim 25, further comprising:
selecting one of the non-volatile storage transistors by turning on a corresponding selection transistor for a reading operation; and
applying a constant or a variable voltage to the control plate of the selected non-volatile storage transistor.

31. The method of claim 25, wherein the selection gates of the unselected non-volatile storage transistors are applied with one of 0V, Vcc~13V, or float for an erasing operation.

32. The method of claim 25, wherein each of the bit lines crossing a selected source line is applied with a voltage equal to a source voltage when a reading or programming operation is carried out by applying the source voltage to the selected cell in order to apply the same voltage to the source and drain of the unselected cell to prevent a leakage current generated from an unselected turned-on cell sharing a word line of the selected cell.

33. A non-volatile semiconductor memory array including a plurality of bit lines arranged in a row direction, a plurality of word lines arranged in a column direction, a plurality of source lines arranged in the row direction, a plurality of control plate lines arranged in the row direction, and a plurality of non-volatile memory cells between the lines, each of the non-volatile memory cells, comprising:

at least two non-volatile storage transistors each of which including a source, a drain, a storage, and a control gate at the storage, wherein at least two control gates are incorporated into one control plate built in a single body and the source of adjacent non-volatile storage transistors is a common source; and at least two selection transistors each of which including a source, a drain, a selection gate between the source and the drain to be isolated from the storage, wherein the source of each of the selection transistors is the drain of a corresponding non-volatile storage transistor, and each of the two selection transistors is connected to the corresponding non-volatile storage transistor for selecting the corresponding non-volatile storage transistor, wherein the selection gates of the respective cells are connected to corresponding word lines in the column direction, the common source is connected to a corresponding source line extending in the row direction, the control plate is connected to a corresponding control place line in the row direction, and the drain of the selection transistor is connected to the corresponding bit line.

34. The array of claim 33, wherein the source of the selected non-volatile storage transistor is applied with a source voltage and a voltage equal to the source voltage is applied to the bit line connected to the drain of the selection transistor for an adjacent non-volatile storage transistor sharing the common source for a reading or programming operation.

35. A non-volatile semiconductor memory comprising:
a semiconductor substrate having active and field regions;
a dielectric layer on the semiconductor substrate;
at least two non-volatile storage transistors on the substrate each of which including a source in the substrate, a drain in the substrate, a storage on the dielectric layer over the active region, and a control gate at the storage, wherein at least two control gates are incorporated into a single control plate and the drain is shared by the adjacent non-volatile storage transistors as a common drain; and
at least two selection transistors on the substrate each of which including a source in the substrate, a drain in the substrate, a selection gate on the dielectric layer between the source and the drain to be isolated from the storage, wherein the drain of each of the selection transistors is the source of the corresponding non-volatile storage transistor, and each of the two selection transistors is connected to the corresponding non-volatile storage transistor for selecting the corresponding non-volatile storage transistor.

36. The memory of claim 35, wherein each of the drains of the selection transistors includes a first drain and a second drain in the first drain, wherein a programming operation is carried out through the first drain, the storage of the corresponding non-volatile storage transistor, and the dielectric layer, and an erasing operation is carried out through the second drain, the storage gate, and the dielectric layer.

37. The memory of claim 35, wherein the programming operation is carried out using a hot carrier injection.

38. The memory of claim 35, wherein the control plate has an opening at a central part to contact the common drain with the bit line.

39. The memory of claim 35, wherein the dielectric layer includes a first portion having a first thickness between the storage and the semiconductor substrate and a second portion having a second thickness different from the first thickness between the selection gate and the semiconductor substrate.

40. A non-volatile semiconductor memory array, comprising:
a plurality of bit lines arranged in a column direction;
a plurality of word lines arranged in a row direction;
a plurality of source lines arranged in the row direction;
a plurality of control plate lines arranged in the row direction; and
a plurality of non-volatile memory cells between the lines, each of the non-volatile memory cells including,
at least two non-volatile storage transistors each of which having a source formed in a substrate, a drain in the substrate, a storage on the dielectric layer over the active region, and a control gate at the storage, wherein at least two control gates are incorporated into a single control plate and the drain is shared by adjacent non-volatile storage transistors as a common drain, and
at least two selection transistors each of which having a source in the substrate, a drain in the substrate, a selection gate on the dielectric layer between the source and the drain to be isolated from the storage, wherein the drain of each of the selection transistors is the source of the corresponding non-volatile storage transistor, and each of the two selection transistors is connected to the corresponding non-volatile storage transistor for selecting the corresponding non-volatile storage transistor, wherein the selection gates of the respective cells are connected to the corresponding word lines in the row direction, the common drain of a unit cell is connected to the corresponding bit line extending in the row direction, the control plate is connected to the corresponding control plate line in the row direction, and the source of the selection transistor in the cell is connected to the corresponding source line.

41. The array of claim 40, wherein the control plate lines and the word lines are formed of the same conductive materials as the control plate and the selection gate, respectively.

42. The array of claim 40, wherein the selection gate of the unselected non-volatile storage transistor is applied with 0V or is floated, the selection gate of the selected non-volatile storage transistor is applied with Vcc~10V for a programming operation, Vcc~7V for a reading operation, the control plate of the selected non-volatile storage transistor is applied with (−)7V~10V, one of (−)10V~(−)5V/0V/(−)10~(−)3V, and 0V~7V for the programming operation, an erasing operation, and the reading operation, respectively, the common drain of the selected non-volatile storage transistor is applied with 2V~7V and 0.5V~2V for the programming operation and the reading operation, respectively, the source of selection transistor for the selected non-volatile storage transistor is applied with Vs(0V~2V), Vcc~10V and Vs for the programming, erasing, and reading operations, respectively, and the substrate is a P-type substrate.

43. The array of claim 40, wherein the selection gate of the selected non-volatile storage transistor is applied with Vcc~10V, Vcc~7V, and 0V~Vpp(Vcc~13V) for programming, reading, and erasing operations, respectively, or is floated for the erasing operation, the control plate of the selected non-volatile storage transistor is applied with (−)7V~10V, (−)13V~0V, and 0V~7V for the programming, erasing, and reading operations, respectively, the common drain of the selected non-volatile storage transistor is applied with 1V~6V and 0.5V~2V for the programming and reading operations, respectively, the source of the selection transistor for the selected non-volatile storage transistor is applied with Vs(0V~2V), Vpp or float, and Vs for the programming, erasing, and reading operations, respectively, and the substrate includes a P-type substrate, an N-type well in the P-type substrate, and a P-type well in the N-type well, 0V is always applied to the P-type substrate, (−)5V~0V and Vpp are applied to the P-type well for the programming and erasing operations, respectively, and 0V and Vpp are applied to the N-type well for the programming and erasing operations, respectively.

44. A non-volatile semiconductor memory, comprising:
a semiconductor substrate having active and field regions;
a dielectric layer on the semiconductor substrate;
at least two non-volatile storage transistors each of which including a source in the substrate, a drain in the substrate, a storage on the dielectric layer over the active region, and a control gate at the storage, wherein at least two control gates are incorporated into a single control plate; and
at least two selection transistors each of which including a source in the substrate, a drain in the substrate, a selection gate on the dielectric layer between the source and the drain to be isolated from the storage, wherein the drain of each of the selection transistors acts as the source of the corresponding non-volatile storage transistor, and each of the two selection transistors is connected to the corresponding non-volatile storage transistor for selecting the corresponding non-volatile storage transistors.

45. The memory of claim 44, wherein the dielectric layer includes a first portion having a first thickness between the storage and the semiconductor substrate and a second portion having a second thickness different from the first thickness between the selection gate and the semiconductor substrate.

46. A non-volatile semiconductor memory array, comprising:
a plurality of bit lines arranged in a row direction;
a plurality of word lines arranged in a column direction;
a plurality of source lines arranged in the row direction;
a plurality of control plate lines arranged in the row direction; and a plurality of non-volatile memory cells between the lines, each of the non-volatile memory cells including,
- at least two non-volatile storage transistors each of which having a source in a substrate, a drain formed in the substrate, a storage on the dielectric layer over the active region, and a control gate at the storage, wherein at least two control gates are incorporated into a single control plate; and
- at least two selection transistors each of which having a source in the substrate, a drain in the substrate, a selection gate on the dielectric layer between the source and the drain to be isolated from the storage, wherein the drain of each of the selection transistors is the source of the corresponding non-volatile storage transistor, and each of the two selection transistors is connected to the corresponding non-volatile storage transistor for selecting the corresponding non-volatile storage transistor, wherein the selection gates of the respective cells are connected together to the corresponding word lines in the column direction, the drains of the cells are connected to the different bit lines, the control plate is connected to the corresponding control plate line in the row direction, and the source of the selection transistor is connected to the corresponding source line.

47. A non-volatile memory comprising:
a semiconductor substrate having active and field regions;
a dielectric layer on the semiconductor substrate;
a first source in the active region;
a common drain in the active region to have a first channel between the common drain and the first source;
a second source in the active region to have a second channel between the common drain and the second source;
a first gate and a first storage on the dielectric layer in parallel with each other over the first channel;
a second gate and a second storage on the dielectric layer in parallel with each other over the second channel; and
a control plate built in a single body over the first and second storage.

48. The memory of claim 47, wherein the control plate has an opening at a central part to contact the common drain with a bit line.

49. A non-volatile semiconductor memory array comprising:
a plurality of bit lines arranged in a column direction;
a plurality of word lines arranged in a row direction;
a plurality of source lines arranged in the row direction;
a plurality of control plate lines arranged in the row direction; and
a plurality of non-volatile memory cells between the lines, each of the non-volatile memory cells including,
- a semiconductor substrate having active and field regions;
- a dielectric layer on the semiconductor substrate;
- a first source in the active region;
- a common drain in the active region to have a first channel between the common drain and the first source;
- a second source in the active region to have a second channel between the common drain and the second source;
- a first gate and a first storage on the dielectric layer in parallel with each other over the first channel;
- a second gate and a second storage on the dielectric layer in parallel with each other over the second channel; and
- a control plate built in a single body over the first and second storage,
wherein the first storage, the common drain, and the control plate form a first non-volatile storage transistor, the first source and the selection gate form a first selection transistor for the first non-volatile storage transistor, the second storage, the common drain, and the control plate form a second non-volatile storage transistor, and the second source and the selection gate form a second selection transistor for the second non-volatile storage transistor, and
wherein the selection gates of the cell are connected to the different corresponding word lines, the common drain is connected to the corresponding bit lines, the control plate is connected to the corresponding control plate lines, and the sources of the selection transistors of the cell are connected to the different source lines.

50. The array of claim 49, wherein the selected common drain is applied with 2V~8V in a programming operation, the control plate of the selected non-volatile storage transistor is applied with (−)5V~10V, a voltage higher than that of a threshold voltage of the selection transistor is applied to the selection gate of the selected selection transistor, and 0~2V lower than the common drain voltage is applied to the source of the selected selection transistor.

51. The array of claim 49, wherein the selection gate of the selected selection transistor is applied with 0V for an erasing operation, the control plate of the selected non-volatile storage transistor is applied with (−)10V~(−)5V or 0V, and the common drain is applied with 0V~8V or 8V~(−)13V.

52. The array of claim 49, wherein the selection gate of the selected selection transistor is applied with Vcc~20V and the control plate of the selected non-volatile storage transistor is applied with (−)8V~0V for an erasing operation.

53. A non-volatile memory comprising:
a first conductive type semiconductor substrate having active and field regions;
a first region in the active region, the first region having a second conductive type;
a second region having the second conductive type to have a first channel between the first and second regions;
a third region having the second conductive type to have a second channel between the second and third regions;
a first non-volatile storage on the first channel to be overlapped at least a portion of the second region;
a first dielectric between the substrate and the first non-volatile storage;
a second non-volatile storage on the second channel to be overlapped at least a portion of the second region;
a second dielectric between the substrate and second non-volatile storage;
a first selection gate over the first channel to be overlapped at least a portion of the first region;
a third dielectric between the first selection gate and substrate;
a fourth dielectric between the first non-volatile storage and first selection gate;
a second selection gate over the second channel to be overlapped at least a portion of the third region;
a fifth dielectric between the second selection gate and the substrate;
a sixth dielectric between the second non-volatile storage and the second selection gate;

a control plate over the first and second non-volatile storage, the control plate built in a single body; and a seventh dielectric between the control plate and the non-volatile storage.

54. The non-volatile semiconductor memory of claim 53, wherein at least two of the first to seventh dielectrics are formed to the same thickness and the same material.

55. The non-volatile semiconductor memory of claim 53, wherein the non-volatile storage is a floating gate.

56. The non-volatile semiconductor memory of claim 53, wherein the non-volatile storage is formed of one of a nitride layer, a stacked nitride/oxide layer, and a stacked oxide/nitride/oxide layer.

57. The non-volatile semiconductor memory of claim 53, wherein the first and second conductive types are P and N, respectively.

58. The non-volatile semiconductor memory of claim 53, wherein the first and third regions are sources and the second region is a common drain.

59. The non-volatile semiconductor memory of claim 53, wherein the selection gate is formed of polysilicon and acts as a spacer.

60. The non-volatile semiconductor memory of claim 53, wherein the control plate has an opening to contact a bit line with the second region.

61. The non-volatile semiconductor memory of claim 60, further comprising a plug between the first and second non-volatile storage, formed of the same material as the selection gates, electrically contacted with the second region through the opening, and electrically isolated from the non-volatile storage and control plate.

62. The non-volatile semiconductor memory of claim 61, wherein the selection gates and plug are formed by anisotropic etch.

63. The non-volatile semiconductor memory of claim 53, further comprising an insulating spacer at a lateral side of the control plate.

64. The non-volatile semiconductor memory of claim 53, wherein the first and second non-volatile storage are thicker than the selection gates.

65. The non-volatile semiconductor memory of claim 53, wherein the selection gate has a thickness greater than an added thickness of the non-volatile storage and the control plate.

66. A memory device comprising:

a plurality of memory cells in first and second directions to form an array of memory cells, the memory device having at least one operating mode for at least one of programming, erasing and reading of the memory cells, each memory cell having a first transistor with a control gate and a storage gate and a second transistor having a selection gate, wherein a pair of adjacent memory cells commonly share a plate line as the control gate of the first transistor, wherein the first transistor of each memory cell further includes first and second electrodes and the second transistor of each memory cell further includes first and second electrodes, and wherein the second electrode of the first transistor is commonly coupled to the first electrode of the second transistor.

67. The memory device of claim 66, wherein the storage gate comprises at least one of polysilicon, metal, silicide, ferroelectric layer and a dielectric.

68. The memory device of claim 66, wherein a word line coupled to the selection gate, a control plate line coupled to the plate line, and a first electrode line coupled to the first electrode of first transistor is formed in one direction, and a bit line coupled to the second electrode of the second transistor is formed in another direction.

69. The memory device of claim 66, wherein a bit line coupled to the second electrode of the second transistor, a control plate line coupled to the plate line, a first electrode line coupled to the first electrode of first transistor is formed in a first direction, and a word line coupled to the selection gate is formed in a second direction.

70. The memory device of claim 66, wherein a word line coupled to the selection gate, a control plate line coupled to the plate line, and a first electrode line coupled to the second electrode of the second transistor is formed in a first direction, and a bit line coupled to the first electrode of first transistor is formed in a second direction.

71. The memory device of claim 66, wherein the first transistor of each memory further includes first and second electrodes and the second transistor of each memory cell further includes first and second electrodes, the second electrode of the first transistor being commonly coupled to the first electrode of the second transistor and the first electrode of the first transistors in the pair of adjacent memory cells is commonly coupled to each other.

72. The memory device of claim 66, wherein the control gate and the storage gate are formed in a split gate structure.

73. The memory device of claim 72, wherein the second transistor includes a first electrode and the first transistor includes a second electrode, a source line coupled to the first electrode, a word line coupled to the selection gate, and a control plate line being coupled to the plate line being formed in the first direction, and a bit line coupled to the second electrode of the first transistor being formed in the second direction.

74. The memory device of claim 73, wherein the second electrode of the first transistors in the pair of adjacent memory cells is commonly coupled to each other.

* * * * *